United States Patent
Lee et al.

(10) Patent No.: US 9,287,477 B2
(45) Date of Patent: Mar. 15, 2016

(54) LIGHT EMITTING DIODE PACKAGE

(75) Inventors: Jae Jin Lee, Ansan-si (KR); Sung Ho Choi, Ansan-si (KR); Duk In Kang, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/124,974

(22) PCT Filed: Feb. 2, 2012

(86) PCT No.: PCT/KR2012/000800
§ 371 (c)(1),
(2), (4) Date: Dec. 12, 2013

(87) PCT Pub. No.: WO2012/169717
PCT Pub. Date: Dec. 13, 2012

(65) Prior Publication Data
US 2014/0110745 A1    Apr. 24, 2014

(30) Foreign Application Priority Data

Jun. 8, 2011 (KR) .......................... 10-2011-0055333
Aug. 5, 2011 (KR) .......................... 10-2011-0078257

(51) Int. Cl.
*H01L 27/32* (2006.01)
*H01L 51/50* (2006.01)
(Continued)

(52) U.S. Cl.
CPC ................ *H01L 33/62* (2013.01); *H01L 27/32* (2013.01); *H01L 33/642* (2013.01); *H01L 33/647* (2013.01); *H01L 51/50* (2013.01); *H01L 2224/48091* (2013.01); *H01L 2224/48247* (2013.01)

(58) Field of Classification Search
CPC .......... H01L 27/32; H01L 51/50; H01L 33/00
See application file for complete search history.

(56) References Cited

U.S. PATENT DOCUMENTS

2009/0189175 A1    7/2009 Park et al.
2009/0315068 A1    12/2009 Oshio et al.
(Continued)

FOREIGN PATENT DOCUMENTS

| JP | 2007-109887 | 4/2007 |
| JP | 2007-280983 | 10/2007 |

(Continued)

OTHER PUBLICATIONS

International Search Report issued on Aug. 22, 2012 in the International Application No. PCT/KR2012/000800.
(Continued)

*Primary Examiner* — Mohammad Choudhry
(74) *Attorney, Agent, or Firm* — H.C. Park & Associates, PLC

(57) ABSTRACT

An LED package includes a lead frame, a housing part, and a lead heat dissipating part. The lead frame includes a first lead mounting an LED chip and a second lead spaced apart from the first lead. The housing part covers a portion of the lead frame and includes an opening part for exposing the LED chip, a first side corresponding to a support side contacting the first lead and the second lead, and a second side opposite to the first side. The lead heat dissipating part is extended from the first lead and exposed partially to the first side of the housing part. Herein, the first side of the housing part is thicker than the second side.

29 Claims, 17 Drawing Sheets

(51) Int. Cl.
  *H01L 33/62* (2010.01)
  *H01L 33/64* (2010.01)

(56) References Cited

U.S. PATENT DOCUMENTS

2010/0001306 A1  1/2010  Park et al.
2011/0031525 A1  2/2011  Nemoto et al.

FOREIGN PATENT DOCUMENTS

| JP | 2009-177111 | 8/2009 |
| JP | 2010-003743 | 1/2010 |
| JP | 2010-034295 | 2/2010 |
| JP | 2011-035306 | 2/2011 |
| KR | 10-2009-0022350 | 3/2009 |
| KR | 10-2009-0082574 | 7/2009 |
| KR | 10-2010-0004895 | 1/2010 |

OTHER PUBLICATIONS

Written Opinion issued on Aug. 22, 2012 in the International Application No. PCT/KR2012/000800.

Notification of Reasons for Refusal issued on Oct. 20, 2015 in Japanese Patent Application No. 2014-514782.

LIGHT EMITTING DIODE PACKAGE

CROSS-REFERENCE TO RELATED APPLICATIONS

This application is the National Stage entry of International Application PCT/KR2012/000800, filed on Feb. 2, 2012, and claims priority from and the benefit of Korean Patent Application No. 10-2011-0055333, filed on Jun. 8, 2011 and Korean Patent Application No. 10-2011-0078257, filed on Aug. 5, 2011, which are incorporated herein by reference for all purposes as if fully set forth herein.

BACKGROUND OF THE INVENTION

1. Field

The present invention relates to light emitting diode (LED) packages.

2. Discussion of the Background

A light emitting diode (LED) is basically a PN junction diode that is the junction of a P-type semiconductor and an N-type semiconductor.

An LED has a PN junction of a P-type semiconductor and an N-type semiconductor. When a forward-bias voltage is applied to the P-type semiconductor and the N-type semiconductor, holes of the P-type semiconductor move toward the N-type semiconductor, while electrons of the N-type semiconductor move toward the P-type semiconductor. Thus, the electrons and the holes move into the PN junction.

In the PN junction, the electrons fall from a conduction band into a valence band and combine with the holes. At this point, the electrons release energy corresponding to the height difference (i.e., energy difference) between the conduction band and the valence band. The energy is released in the form of light.

As light emitting semiconductor devices, LEDs have various advantages such as environment-friendly, low operation voltage, long lifetime, and low price. LEDs have been widely used as indicator lamps to display simple information such as numerals. Recently, with the development of industrial technology such as information display technology and semiconductor technology, LEDs are used as a light source of a display device such as a liquid crystal display (LCD) device.

As a light source of a backlight unit, LEDs are used in the form of a side-view LED package. With the trend toward the slimness and large screen size of LED devices, LED packages are developed to become thinner. However, the thin LED packages may be easily collapsed or inclined when mounted.

SUMMARY

An aspect of the present invention is directed to a thin LED package that is prevented from being easily collapsed or inclined when mounted.

Another aspect of the present invention is directed to a thin LED package that includes a support member for preventing the LED package from being easily collapsed or inclined when mounted.

Another aspect of the present invention is directed to a thin LED package that is stably installed in a carrier tape pocket when moved or handled during processes.

Another aspect of the present invention is directed to a thin LED package that is prevented from being misaligned when moved or handled during processes.

Another aspect of the present invention is directed to a backlight unit including the LED package.

Another aspect of the present invention is directed to a backlight unit including the LED package whose height is compensated such that an LED chip is located on the central axis of a light guide plate.

According to an embodiment of the present invention, an LED package includes: a lead frame including a first lead mounting an LED chip and a second lead spaced apart from the first lead; a housing part covering a portion of the lead frame and including an opening part for exposing the LED chip, a first side corresponding to a support side contacting the first lead and the second lead, and a second side opposite to the first side; and a lead heat dissipating part extended from the first lead and exposed partially to the first side of the housing part. Herein, the first side of the housing part may be thicker than the second side.

The first lead may include one or more heat dissipating contact parts and a first lead terminal part extended on the support side. The second lead may include a second lead terminal part extended on the support side. The housing part may include one or more support parts on the support side.

The first lead may include a first lead body covered at least partially by the housing part, a first lead extension part for connecting the first lead body and the first lead terminal part, and a heat dissipating extension part for connecting the first lead body and the heat dissipating contact part. The second lead may include a second lead body and a second lead extension part for connecting the second lead body and the second lead terminal part.

The first lead terminal part and the second lead terminal part may be wider than the first lead extension part and the second lead extension part. The first lead extension part, the heat dissipating extension part, and the second lead extension part may be bent at least one time such that the first lead terminal part, the heat dissipating contact part, and the second lead terminal part are disposed on the support side.

The surface of the first lead terminal part, the surface of the heat dissipating contact part, and the surface of the second lead terminal part may be located on the same plane as the surface of the support side.

The first lead body may include a mounting part exposed through the opening part.

The mounting part may be a concave portion of the first lead body.

The mounting part may include: a bottom part; and a side part inclined at an angle and extended from the bottom part to connect the bottom part and another portion of the first lead body. Herein, the LED chip may be mounted on the bottom part closer to the side of the second lead body, instead of being mounted on the center of the bottom part.

The opening part may expose the mounting part and expose a portion of the first lead body and a portion of the second lead body.

The housing part may include an exposing part for exposing a portion of the other side of the first lead.

The first lead may include a mounting part exposed by the opening part, and the mounting part may include a bottom part and a side part inclined at an angle extended from the bottom part to connect the bottom part and another portion of the first lead body. Herein, the exposing part may expose the rear side of the bottom part mounting the LED chip.

The housing part may include four edges. The edge of the support side, among four edges contacting the four sides, may be wider than the edge contacting an upper side that is opposite to the support side.

The heat dissipating extension part may be connected to the first lead body through the support side. The first lead extension part may be connected to the first lead body through one of two sides adjacent to the support side. The second lead extension part may be connected to the second lead body through the other of the two sides adjacent to the support side.

The heat dissipating extension part may be bent one time, and the first lead extension part and the second lead extension part may be bent two times.

The heat dissipating contact part may be disposed at the center of the support side. The first lead terminal part and the second lead terminal part may be disposed at both edges of the support side. The support parts may be two in number and be disposed respectively between the heat dissipating contact part and the first lead terminal part and between the heat dissipating contact part and the second lead terminal part.

The first lead terminal part and the second lead terminal part may be disposed at both edges of the support side. The support part may be disposed at the center of the support side. The heat dissipating contact parts may be two in number and be disposed respectively between the support part and the first lead terminal part and between the support part and the second lead terminal part.

The first lead terminal part and the second lead terminal part may be disposed at both edges of the support side. One or more support parts may be disposed on the support side between the first lead terminal part and the second lead terminal part. The lead heat dissipating part may be a portion of a heat dissipating extension part exposed to the surface of the support part.

The opening part may include a side inclined at an angle.

The LED package may include a support member extended from at least one of the first lead, the second lead, the lead heat dissipating part, and the housing part to support the housing part covering the lead frame when the housing part covering the lead frame is mounted on a substrate or a device.

The first lead may include a first lead terminal part extended on the support side. The second lead may include a second lead terminal part extended on the support side. The lead heat dissipating part may include a heat dissipating contact part extended on the support side. The housing part may include one or more protrusion parts protruding on the support side. One or more of the first lead terminal part, the second lead terminal part, and the heat dissipating contact part may be the support member.

The surface of the first lead terminal part, the surface of the heat dissipating contact part, and the surface of the second lead terminal part may be located on the same plane. The protrusion part may protrude toward the bottom side of the LED package by a predetermined length with respect to the surface of the first lead terminal part, the surface of the heat dissipating contact part, and the surface of the second lead terminal part.

The first lead terminal part or the second lead terminal part may protrude toward the front or rear side of the LED package by a predetermined length.

The heat dissipating contact part may protrude toward the front or rear side of the LED package by a predetermined length.

The first lead may include a first lead body covered at least partially by the housing part and a first lead extension part connecting the first lead body and the first lead terminal part. The second lead may include a second lead body and a second lead extension part connecting the second lead body and the second lead terminal part. The lead heat dissipating part may include a heat dissipating extension part connecting the first lead body and the heat dissipating contact part.

The surface of the first lead terminal part, the surface of the heat dissipating contact part, the surface of the second lead terminal part, and the surface of the protrusion part may be located on the same plane.

The heat dissipating contact part may be disposed at the center of the support side. The first lead terminal part and the second lead terminal part may be disposed at both edges of the support side. The protrusion parts may be two in number and be disposed respectively between the heat dissipating contact part and the first lead terminal part and between the heat dissipating contact part and the second lead terminal part.

The first lead terminal part and the second lead terminal part may be disposed at both edges of the support side. One or more protrusion parts may be disposed on the support side between the first lead terminal part and the second lead terminal part. The lead heat dissipating part may be a portion of a heat dissipating extension part exposed to the surface of the protrusion part.

The first lead terminal part and the second lead terminal part may be located on the same plane. The heat dissipating extension part may be the support member protruding toward the bottom side of the LED package by a predetermined length with respect to the surface of the first lead terminal part and the surface of the second lead terminal part.

Advantageous Effects of Invention

According to the present invention, a thin LED package is prevented from being easily collapsed or inclined when mounted.

According to the present invention, a thin LED package includes a support member for preventing the LED package from being easily collapsed or inclined when mounted.

According to the present invention, a thin LED package is stably installed in a carrier tape pocket when moved or handled during processes.

According to the present invention, a thin LED package is prevented from being misaligned when moved or handled during processes.

According to the present invention, a backlight unit includes the LED package.

According to the present invention, a backlight unit includes the LED package whose height is compensated such that an LED chip is located on the central axis of a light guide plate.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
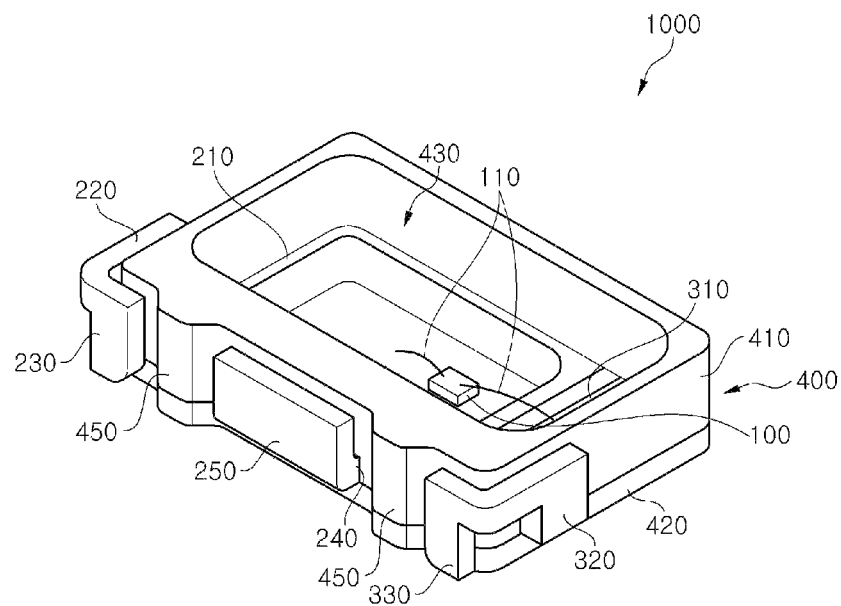
FIG. 1 is a perspective view of an LED package according to an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like elements.

FIGS. 1 to 8 are views showing an LED package according to an exemplary embodiment of the present invention.

Figure 2:
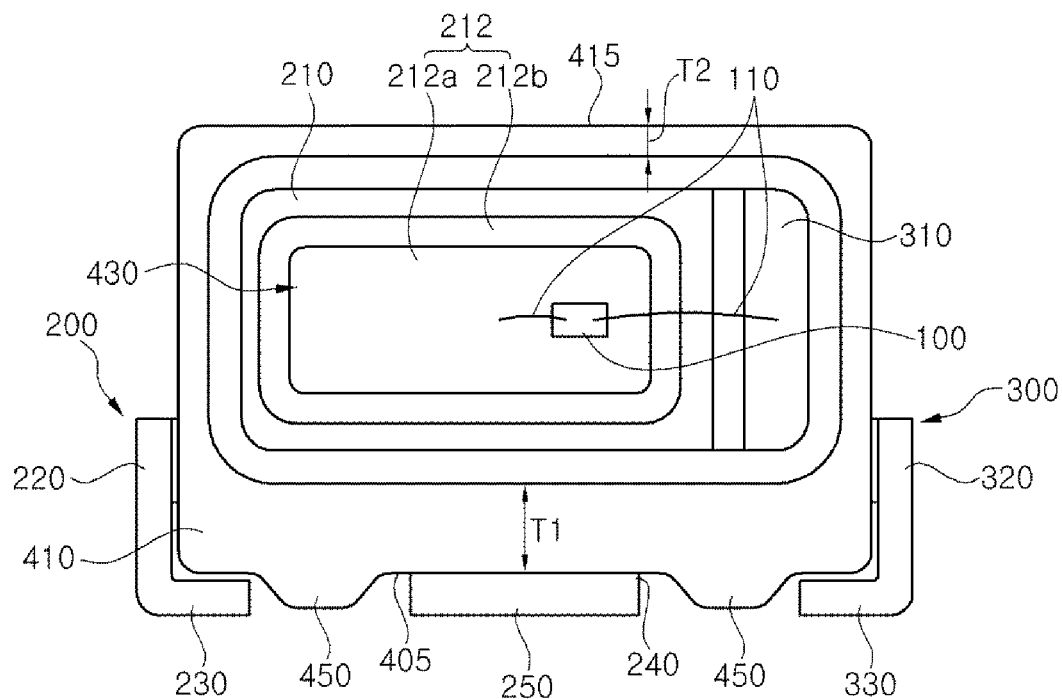
FIG. 2 is a front view of the LED package shown in FIG. 1.
Figure 3:
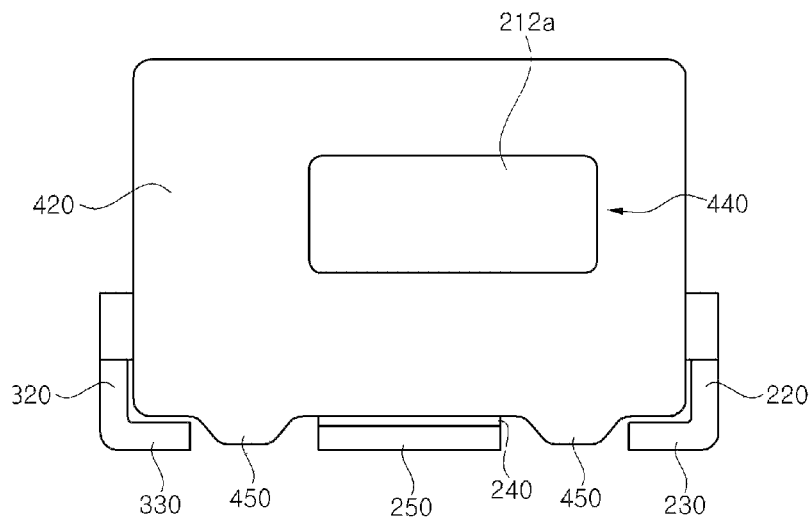
FIG. 3 is a rear view of the LED package shown in FIG. 1.
Figure 4:
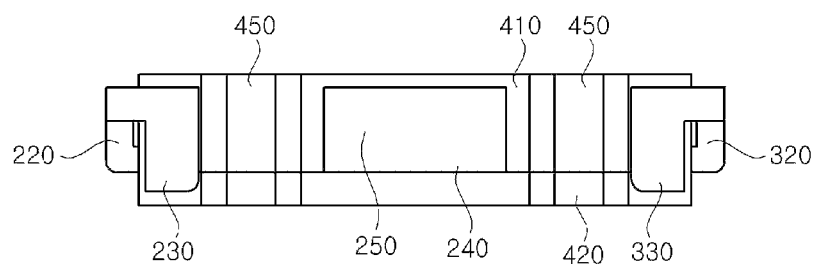
FIG. 4 is a bottom view of the LED package shown in FIG. 1.
Figure 5:
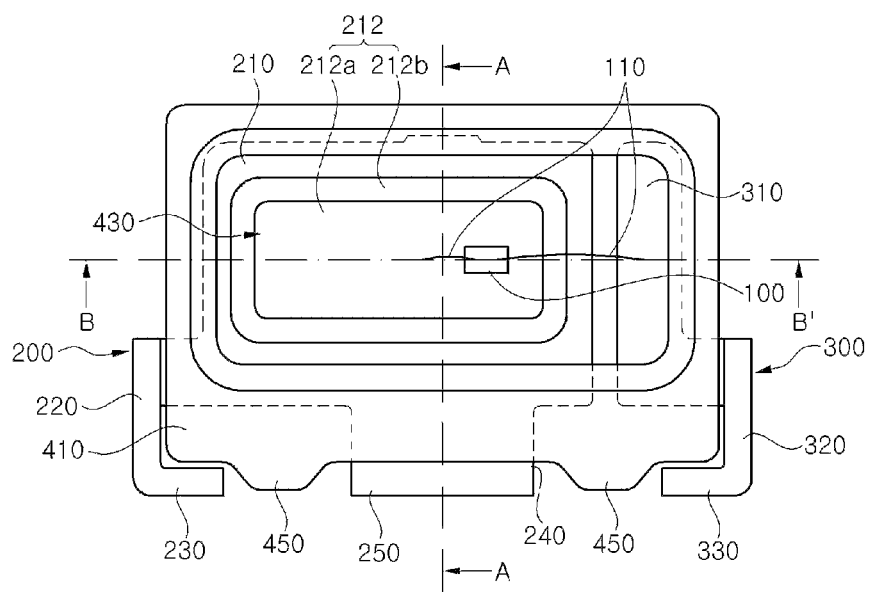
FIG. 5 is a front projection view of the LED package shown in FIG. 1.
Figure 6:
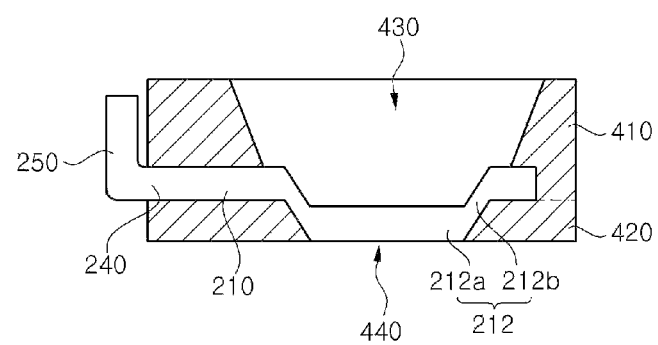
FIG. 6 is a sectional view taken along line A-A' of FIG. 5.
Figure 7:
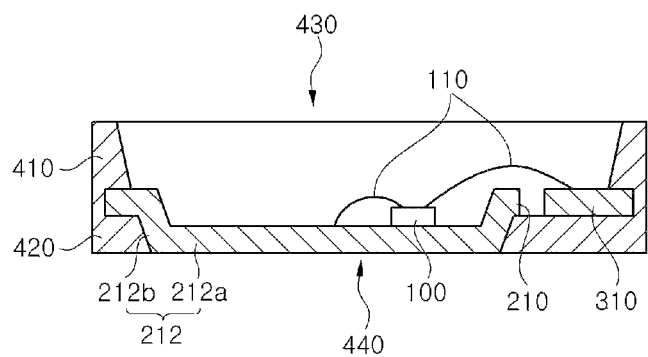
FIG. 7 is a sectional view taken along line B-B' of FIG. 5.
Figure 8:
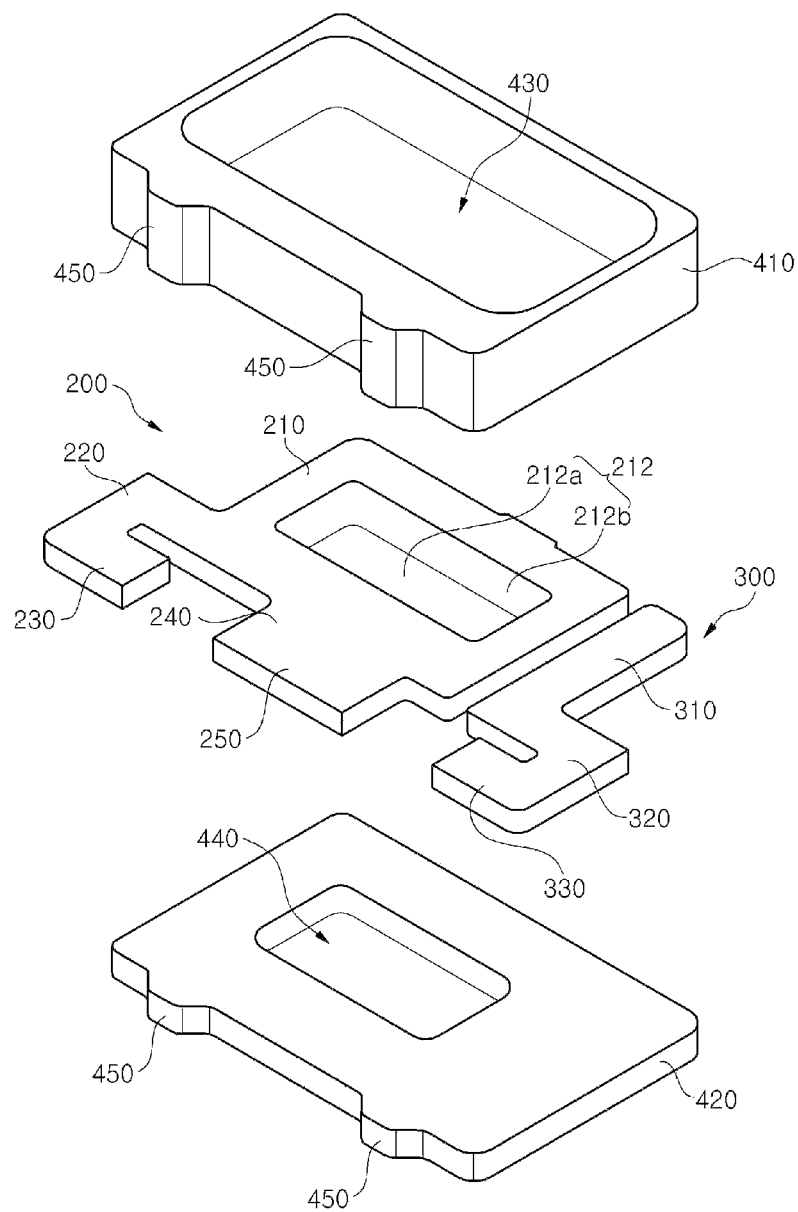
FIG. 8 is an exploded perspective view of the LED package shown in FIG. 1.

FIG. 1 is a perspective view of an LED package according to an exemplary embodiment of the present invention. FIG. 2 is a front view of the LED package shown in FIG. 1. FIG. 3 is a rear view of the LED package shown in FIG. 1. FIG. 4 is a bottom view of the LED package shown in FIG. 1. FIG. 5 is a front projection view of the LED package shown in FIG. 1. FIG. 6 is a sectional view taken along line A-A' of FIG. 5. FIG. 7 is a sectional view taken along line B-B' of FIG. 5. FIG. 8 is an exploded perspective view of the LED package shown in FIG. 1.

Referring to FIGS. 1 to 8, an LED package 1000 according to an exemplary embodiment of the present invention may include an LED chip 100, a lead frame 200/300, and a housing part 400.

Although not shown in the drawings, the LED chip 100 may have a semiconductor structure disposed on a growth substrate or a mount substrate. The semiconductor structure may include an N-type semiconductor layer (not shown), a P-type semiconductor layer (not shown), and an active layer disposed between the N-type semiconductor layer and the P-type semiconductor layer. The semiconductor structure may have a structure for emitting one or more wavelengths. The LED chip 100 may have one or more semiconductor structures disposed on a growth substrate or a mount substrate, and may have a plurality of growth substrates or mount substrates that are connected in parallel or in series and have one or more semiconductor structures disposed thereon.

The lead frame 200/300 may include a first lead 200 and a second lead 300.

The first lead 200 may include a first lead body 210, a first lead extension part 220, a first lead terminal part 230, and a lead heat dissipating part 240/250. The first lead body 210 may have a mounting part 212. The mounting part 212 may have a bottom part 212a and a side part 212b. The lead heat dissipating part 240/250 may include a heat dissipating extension part 240 and a heat dissipating contact part 250.

The second lead 300 may include a second lead body 310, a second lead extension part 320, and a second lead terminal part 330.

The housing part 400 may include an upper housing part 410, a lower housing part 420, an opening part 430, an exposing part 440, and a support part 450.

The LED chip 100 may be disposed on one side of the first lead 200. For example, the LED chip 100 may be disposed on a predetermined region of the first lead body 210 of the first lead 200. Specifically, the LED chip 100 may be disposed on the bottom part 212a of the mounting part 212.

The mounting part 212 may be a portion of the first lead body 210 of the first lead 200. For example, the mounting part 212 may be a concave portion of the first lead body 210.

The mounting part 212 may be exposed by the housing part 400. Specifically, the mounting part 212 may be exposed by the opening part 430 disposed at the upper housing part 410.

As described above, the mounting part 212 may have the bottom part 212a and the side part 212b. One side of the bottom part 212a may mount the LED chip 100, and the other side of the bottom part 212a may be exposed through the exposing part 440 disposed at the lower housing part 420. The bottom part 212a exposed through the exposing part 440 may dissipate heat generated by the LED chip 100.

The side part 212b of the mounting part 212 may extend from the bottom part 212a, and may connect the bottom part 212a and the other part of the first lead body 210, i.e., the first lead body 210 except the mounting part 212. The side part 212b may be inclined at an angle to the bottom part 212a and serve as a reflection surface for reflecting light that is emitted by the LED chip 100 mounted on the bottom part 212a.

As shown in FIG. 2, the LED chip 100 may be mounted on the bottom part 212a of the mounting part 212 closer to the side of the second lead body 310, instead of being mounted on the center of the bottom part 212a of the mounting part 212.

The LED chip 100 may be mounted on the lead frame 200/300 in various configurations. However, when the LED chip 100 is connected by wires 110 as shown in the drawings, and when the LED chip 100 is mounted on the center of the bottom part 212a of the mounting part 212, the wire 110 connecting the LED chip 100 and the second lead body 310 may be disconnected due to the great distance between the LED chip 100 and the second lead body 310. Therefore, it may be preferable that the LED chip 100 is mounted on the bottom part 212a of the mounting part 212 closer to the side of the second lead body 310.

Although the drawings show that the LED chip 100 is connected by two wires 110, it will be understood that the LED chip 100 may be connected by two wires 110 or by only one wire 110 according to the shape or type of the LED chip 100.

As described above, the first lead 200 may include the first lead body 210 having the mounting part 212, the first lead extension part 220, the first lead terminal part 230, and the lead heat dissipating part 240/250, and the lead heat dissipating part 240/250 may include the heat dissipating extension part 240 and the heat dissipating contact part 250.

The first lead body 210 may have a portion covered by the housing part 400. The first lead body 210 may have the mounting part 212 with a concave portion.

The first lead extension part 220 may extend from the first lead body 210, and may connect with the first lead terminal part 230. The first lead extension part 220 may have a portion covered by the housing part 400 and the other portion exposed to the outside. The first lead extension part 220 may be bent one or more times so that the first lead terminal part 230 may be disposed on one side (i.e., a support side 405) of the housing part 400, which will be described below. The support side 405 may contact a substrate or a device that will mount the LED package 1000.

The first lead extension part 220 may extend from the first lead body 210. Herein, when exposed through any one of two sides adjacent to one side (i.e., a support side 405) of the housing part 400, the first lead extension part 220 may be bent two times so that the first lead terminal part 230 may be disposed on the support side 405. A thickness T1 of the support side 405 of the housing part 400 may be greater than a thickness T2 of an opposite side 415, as shown in a plan view in FIG. 2.

When the LED package 1000 is mounted on a substrate or a device, the first lead terminal part 230 may not only serve as an electric terminal of the LED package 1000 and but also support the LED package 1000. When the LED package 1000 is mounted on a substrate or a device, the first lead terminal part 230 may be adhered with solder or paste to a terminal disposed on the substrate or the device. Therefore, it may be preferable that the first lead terminal part 230 has a large surface area. Thus, the first lead terminal part 230 may be wider than the first lead extension part 220. The first lead extension part 220 may be narrow because it has a bent portion, whereas the first lead terminal part 230 may be wide because it has a large surface area.

The heat dissipating extension part 240 may extend from the first lead body 210 through the support side 405 of the housing part 400. The heat dissipating extension part 240 may connect with the heat dissipating contact part 250. The heat dissipating extension part 240 may be bent at least one time so that the heat dissipating contact part 250 may be disposed on the support side 405 of the housing part 400.

The heat dissipating contact part 250 may dissipate heat that is generated by the LED chip 100 mounted on the mounting part 212 of the first lead body 210. Also, like the first lead terminal part 230, the heat dissipating contact part 250 may not only serve as an electric terminal but also support the LED package 1000.

When the heat dissipating contact part 250 plays a greater role in supporting the LED package 1000 than in dissipating the heat generated by the LED chip 100, the heat dissipating extension part 240 may be narrower than the heat dissipating contact part 250 so that it may be easily bent. On the other hand, when the heat dissipating contact part 250 plays the greater role in dissipating the heat generated by the LED chip 100, the heat dissipating extension part 240 may have the same width as the heat dissipating contact part 250, in order to increase the thermal conductivity.

As described above, the second lead 300 may include the second lead body 310, the second lead extension part 320, and the second lead terminal part 330.

The second lead body 310 may be spaced apart from the first lead body 210 by a predetermined distance. The second lead body 310 may have a portion covered by the housing part 400 and another portion exposed by the opening part 430 of the housing part 400. The exposed portion of the second lead body 310 may be connected by the wire 110 to the LED chip 100.

The second lead extension part 320 and the second lead terminal part 330 may correspond to the first lead extension part 220 and the first lead terminal part 230. That is, the second lead extension part 320 may extend from the second lead body 310, and may connect with the second lead terminal part 330. The second lead extension part 320 may have a portion covered by the housing part 400 and the other portion exposed to the outside. The second lead extension part 320 may be bent one or more times so that the second lead terminal part 330 may be disposed on one side (i.e., a support side 405) of the housing part 400, which will be described below.

The second lead extension part 320 may extend from the second lead body 310. Herein, when exposed through any one of two sides adjacent to one side (i.e., a support side 405) of the housing part 400, the second lead extension part 320 may be bent two times so that the second lead terminal part 330 may be disposed on the support side 405.

When the LED package 1000 is mounted on a substrate or a device, the second lead terminal part 330 may not only serve as an electric terminal of the LED package 1000 and but also support the LED package 1000. When the LED package 1000 is mounted on a substrate or a device, the second lead terminal part 330 may be adhered with solder or paste to a terminal disposed on the substrate or the device. Therefore, it may be preferable that the second lead terminal part 330 has a large surface area. Thus, the second lead terminal part 330 may be wider than the second lead extension part 320. The second lead extension part 320 may be narrow because it has a bent portion, whereas the second lead terminal part 330 may be wide because it has a large surface area.

As described above, the housing part 400 may include the upper housing part 410, the lower housing part 420, the opening part 430, the exposing part 440, and the support part 450.

It has been shown and described above that the housing part 400 is divided into the upper housing part 410 and the lower housing part 420. However, it will be understood that the housing part 400 may be one part instead of being divided into the upper housing part 410 and the lower housing part 420.

The housing part 400 may cover a portion of the first lead 200 and a portion of the second lead 300. The housing part 400 may have the opening part 430 at the upper housing part 410 to expose the mounting part 212 mounting the LED chip 100. Also, the housing part 400 may have the exposing part 440 at the lower housing part 420 to expose the rear side of the mounting part 212, specifically the rear surface of the bottom part 212a of the mounting part 212.

The opening part 430 of the housing part 400 may be inclined at an angle to the bottom part 212a. When the side of the opening part 430 is inclined at an angle to the bottom part 212a, it may be used as a reflection surface for reflecting light emitting by the LED chip 100.

The housing part 400 may have four sides, any one of which may be the support side 405 described above. One or more support parts 450 may be disposed at the support side 405. The support parts 450 may protrude from the support side 405 of the housing part 400 at regular intervals. When the LED package 1000 is mounted on a substrate or a device, not only the support part 450 but also the first lead terminal part 230, the second lead terminal part 330 and the heat dissipating contact part 250 may contact the substrate or the device to prevent the LED package 1000 from being mounted at an angle onto the substrate or the device, or being collapsed after being mounted on the substrate or the device.

The support part 450 may have a constant thickness and a variable width decreasing away from the support side 405. That is, the support part 450 may have a trapezoidal shape with a uniform thickness. The support part 450 may have the same thickness as the housing part 400, and the thickness of the support part 450 may be constant regardless of the distance from the support side 405.

The surfaces of the first lead terminal part 230, the second lead terminal part 330, the heat dissipating contact part 250 and the support part 450 may be located on the same plane. When the LED package 1000 is mounted on a substrate or a device, the surfaces of the first lead terminal part 230, the second lead terminal part 330, the heat dissipating contact part 250 and the support part 450 on the support side 405 may have the maximum contact area with respect to the surface of the substrate or the device to prevent the LED package 1000 from being collapsed or inclined.

This may be implemented by configuring the LED package 1000 to have a low gravitational center, i.e., a gravitational center lower than a geometrical center. For example, the LED package 1000 may have a low gravitational center by disposing not only the first lead terminal part 230, the second lead terminal part 330 and the heat dissipating contact part 250 but also the support part 450 on the support side 405, as described above.

Also, the LED package 1000 may have a low gravitational center by forming the edge (among the four edges of the housing part 400) contacting the support side 405, to be wider than the edge contacting an upper side that is opposite to the support side 405, preferably by forming the edge contacting the support side 405, to be wider than the edges contacting the upper side and both sides that are adjacent to the support side 405.

Two support parts 450 may be disposed on the support side 405. In this case, as shown in the drawings, the heat dissipating contact part 250 may be disposed at the center of the support side 405. The first lead terminal part 230 and the second lead terminal part 330 may be disposed at both edges of the support side 405. One of the two support parts 450 may be disposed between the first lead terminal part 230 and the heat dissipating contact part 250, and the other support part 450 may be disposed between the heat dissipating part 250 and the second lead terminal part 330. In this case, the support side 405 may be symmetrical with respect to the heat dissipating contact part 250 to prevent the LED package 1000 from being inclined to the front and rear sides or to both sides.

Figure 9:
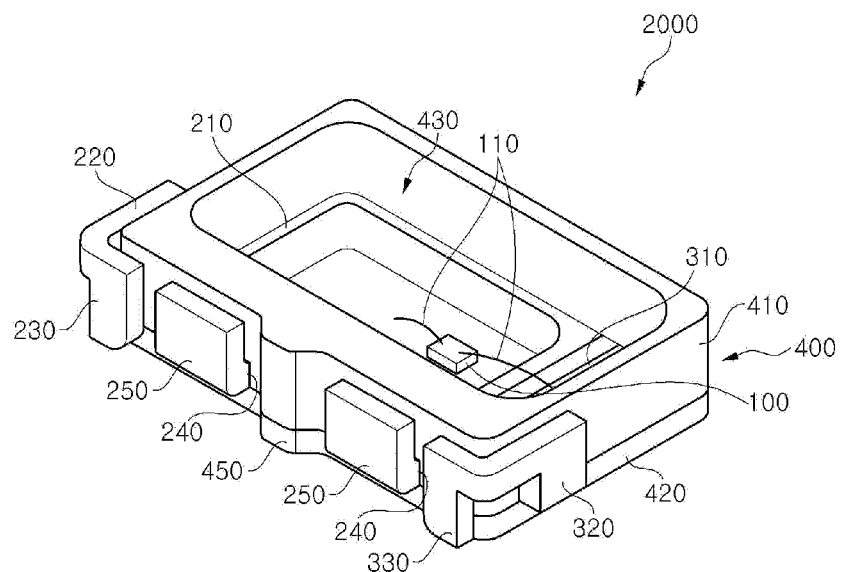
FIG. 9 is a perspective view of an LED package according to another exemplary embodiment of the present invention.

FIG. 9 is a perspective view of an LED package according to another exemplary embodiment of the present invention.

Referring to FIG. 9, an LED package 2000 according to another exemplary embodiment of the present invention may have a support part 450 on the support side 405. The support part 450 may be disposed at the center of the support side 405. One or more heat dissipating contact parts 250 may be disposed respectively at both sides of the support part 450. The first lead terminal part 230 and the second lead terminal part 330 may be disposed respectively at the outsides of the heat dissipating contact parts 250, i.e., at both edges of the support side 405. The other structures are identical to those of the LED package 1000 described with reference to FIGS. 1 to 8, and thus a detailed description thereof will be omitted for conciseness.

That is, the LED package 1000 and the LED package 2000 have the same structures with the exception that they differ in the number and positions of the support parts 450 and the heat dissipating contact parts 250.

Figure 10:
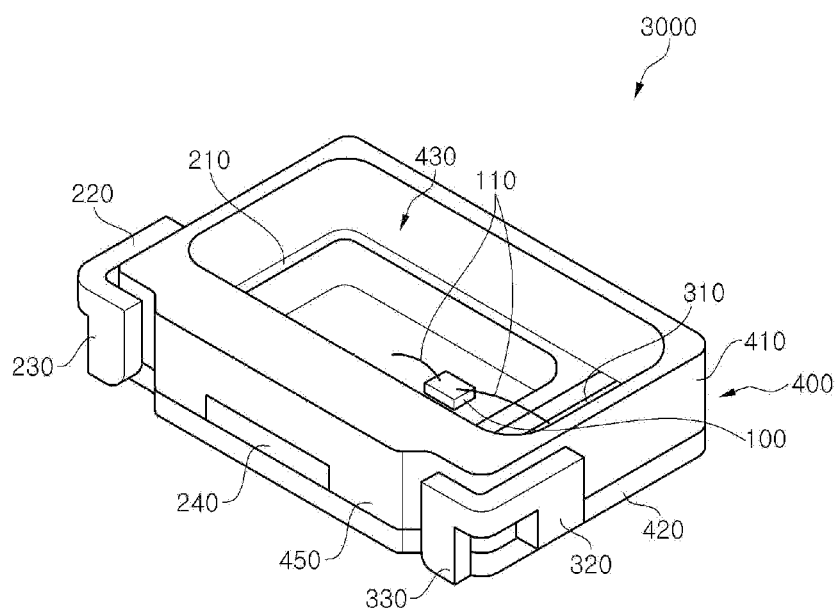
FIG. 10 is a perspective view of an LED package according to another exemplary embodiment of the present invention.

FIG. 10 is a perspective view of an LED package according to another exemplary embodiment of the present invention.

Referring to FIG. 10, an LED package 3000 according to another exemplary embodiment of the present invention has the same structures as the LED package 1000 of FIGS. 1 to 8 with the exception that it has the first lead terminal part 230, the second lead terminal part 330, and the support part 450 on the support side 405 without having the lead heat dissipating part 240/250 (specifically, the heat dissipating contact part 250 of the lead heat dissipating part 240/250) on the support side 405.

That is, the LED package 3000 may have the first lead terminal part 230 and the second lead terminal part 330 disposed at both edges of the support side 405, and the support part 450 disposed on almost all the surfaces of the support side 405, including the center of the support side 405, except both edges of the support side 405. A portion of the lead heat dissipating part 240/250 (preferably, a portion of the heat dissipating extension part 240) may be exposed on the surface of the support part 450.

Although FIG. 10 shows that one support part 450 is disposed on the support side 405, it will be understood that two or more support parts 450 may be disposed on the support side 405.

Figure 11:
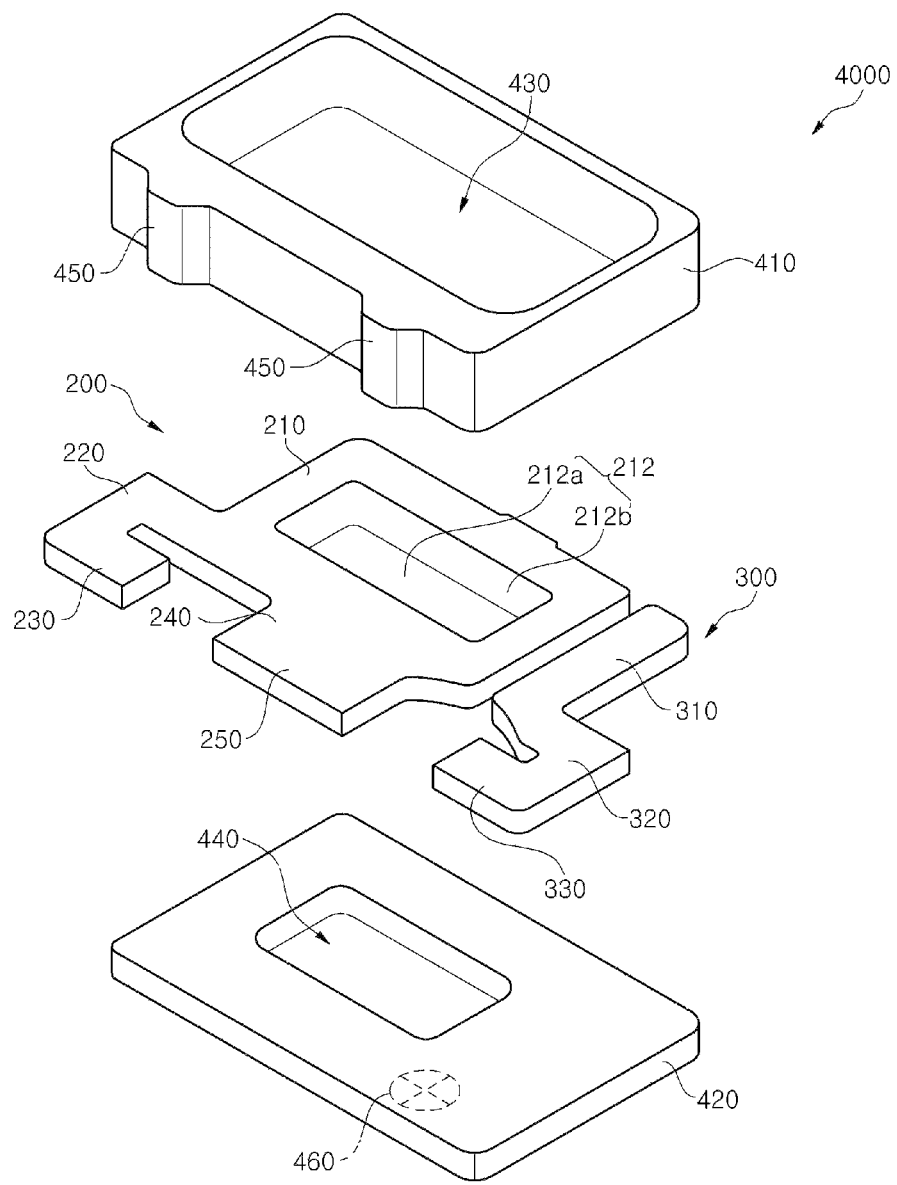
FIG. 11 is an exploded perspective view of an LED package according to another exemplary embodiment of the present invention.

FIG. 11 is an exploded perspective view of an LED package according to another exemplary embodiment of the present invention.

Referring to FIG. 11, an LED package 4000 according to another exemplary embodiment of the present invention has the same structures as the LED package 1000 of FIGS. 1 to 8 with the exception that they differ in the structures of the lead frame 200/300 and the lower housing part 420.

The LED package 4000 may have a resin injection port 460 at a predetermined position of the rear side of the lower housing part 420 without having the support part 450 at the lower housing part 420. Since the support part 450 is not provided at the lower housing part 420, the lower housing part 420 may have a substantially rectangular shape.

The resin injection port 460 may be used to inject resin to form the housing part 400. When the resin injection port 460 is provided at a predetermined position of the lower housing part 420, the first lead 200 and the second lead 300 located corresponding to the resin injection port 460 may be modified as shown in FIG. 11, so as not to interrupt the flow of resin injected through the resin injection port 460.

Figure 12:
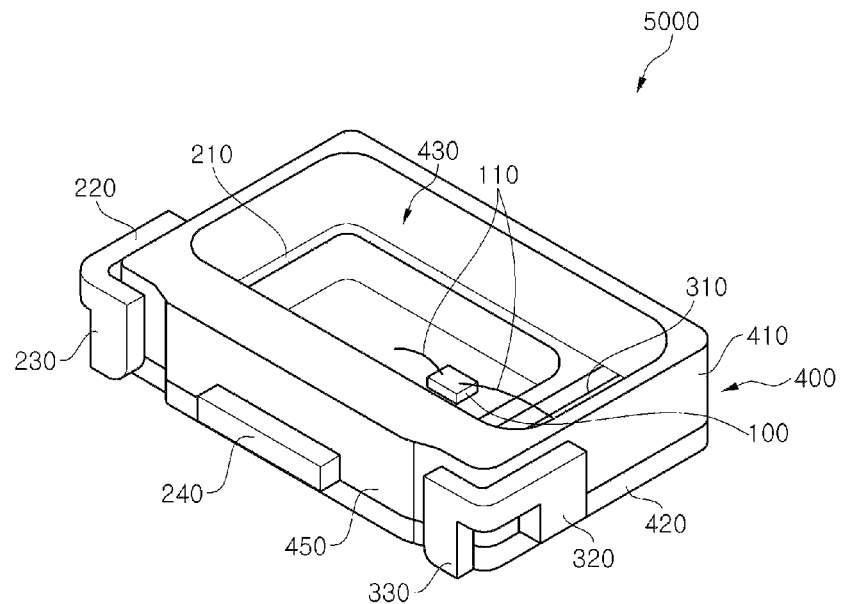
FIG. 12 is a perspective view of an LED package according to another exemplary embodiment of the present invention.

FIG. 12 is a perspective view of an LED package according to another exemplary embodiment of the present invention.

Referring to FIG. 12, an LED package 5000 according to another exemplary embodiment of the present invention has the same structures as the LED package 1000 of FIGS. 1 to 8 with the exception that it has the first lead terminal part 230, the second lead terminal part 330, and the support part 450 on the support side 405 without having the lead heat dissipating part 240/250 (specifically, the heat dissipating contact part 250 of the lead heat dissipating part 240/250) on the support side 405.

That is, the LED package 5000 may have the first lead terminal part 230 and the second lead terminal part 330 disposed at both edges of the support side 405, and the support part 450 disposed on almost all the surfaces of the support side 405, including the center of the support side 405, except both edges of the support side 405. A portion of the lead heat dissipating part 240/250 (preferably, a portion of the heat dissipating extension part 240) may be exposed on the surface of the support part 450 by extending from the support part 450. The end of the heat dissipating extension part 240 may be disposed on the same plane as the first lead terminal part 230 and the second lead terminal part 330. That is, the end of the heat dissipating extension part 240, the surface of the first lead terminal part 230, and the surface of the second lead terminal part 330 may be disposed on the same plane. Although FIG. 12 shows that the heat dissipating extension part 240 is exposed on the surface of the support part 450, it will be understood that the end of the heat dissipating extension part 240 may be bent to the front or rear side of the LED package 5000 after being exposed on the surface of the support part 450.

FIGS. 13 to 23 are views showing an LED package according to another exemplary embodiment of the present invention.

Figure 13:
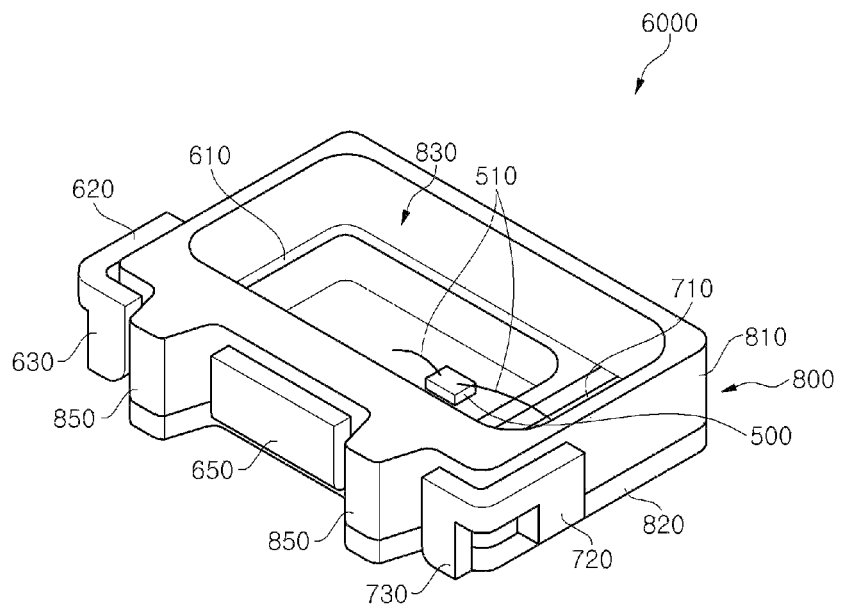
FIG. 13 is a perspective view of an LED package according to another exemplary embodiment of the present invention.
Figure 14:
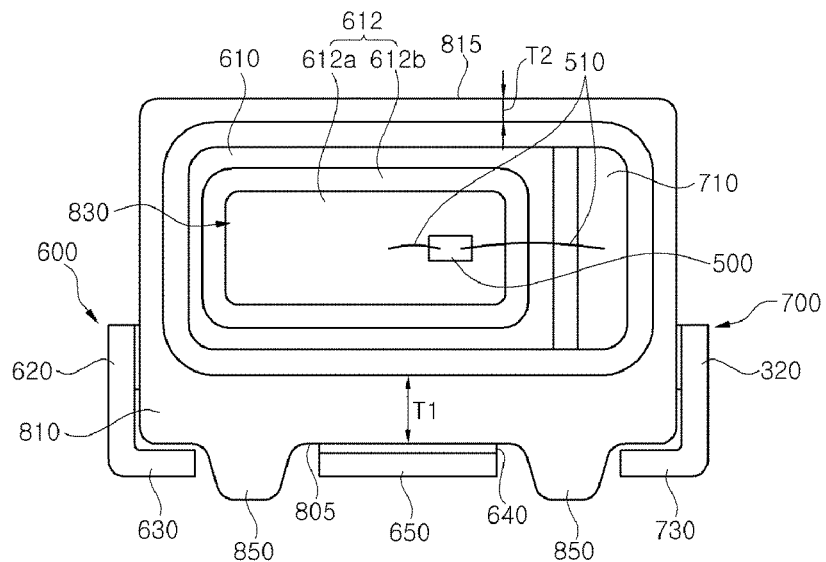
FIG. 14 is a front view of the LED package shown in FIG. 13.
Figure 15:
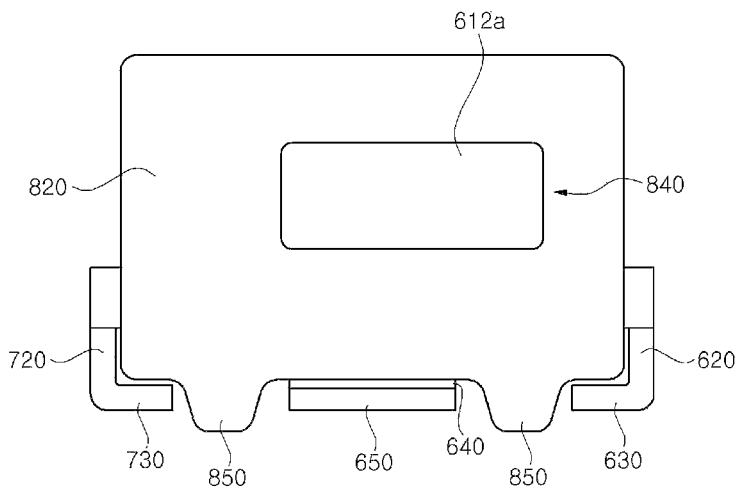
FIG. 15 is a rear view of the LED package shown in FIG. 13.
Figure 16:
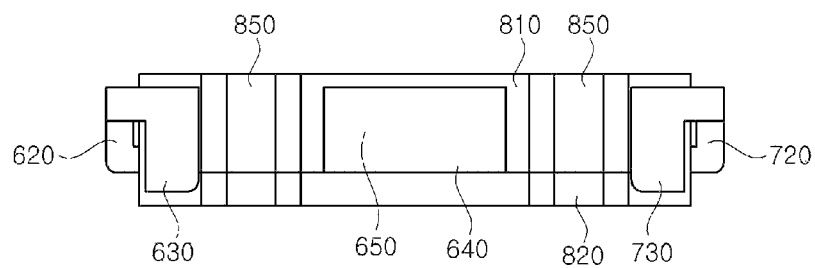
FIG. 16 is a bottom view of the LED package shown in FIG. 13.
Figure 17:
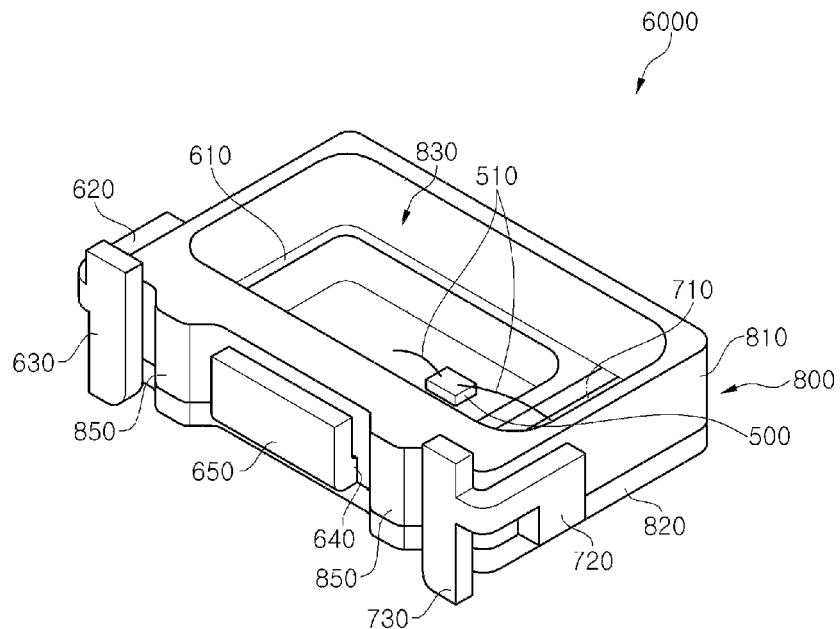
FIG. 17 is a perspective view of an LED package according to another exemplary embodiment of the present invention.
Figure 18:
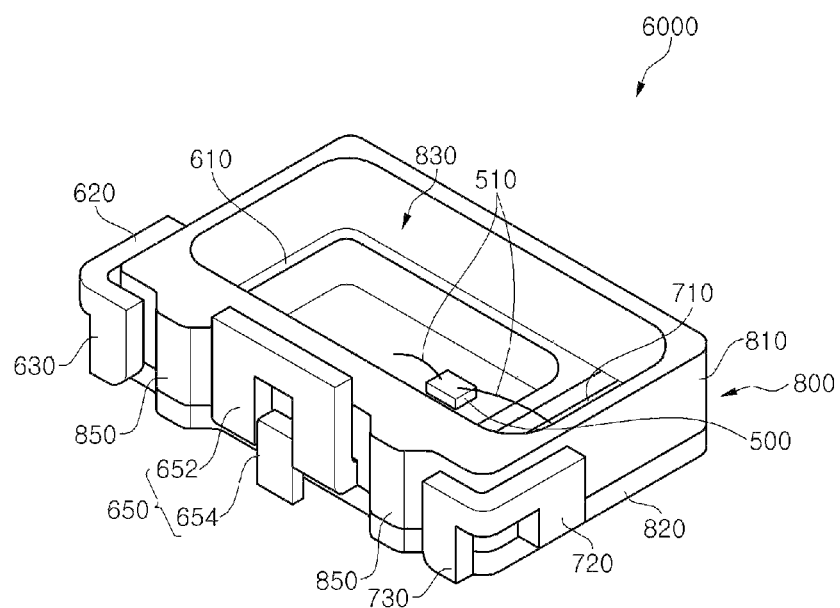
FIG. 18 is a perspective view of an LED package according to another exemplary embodiment of the present invention.
Figure 19:
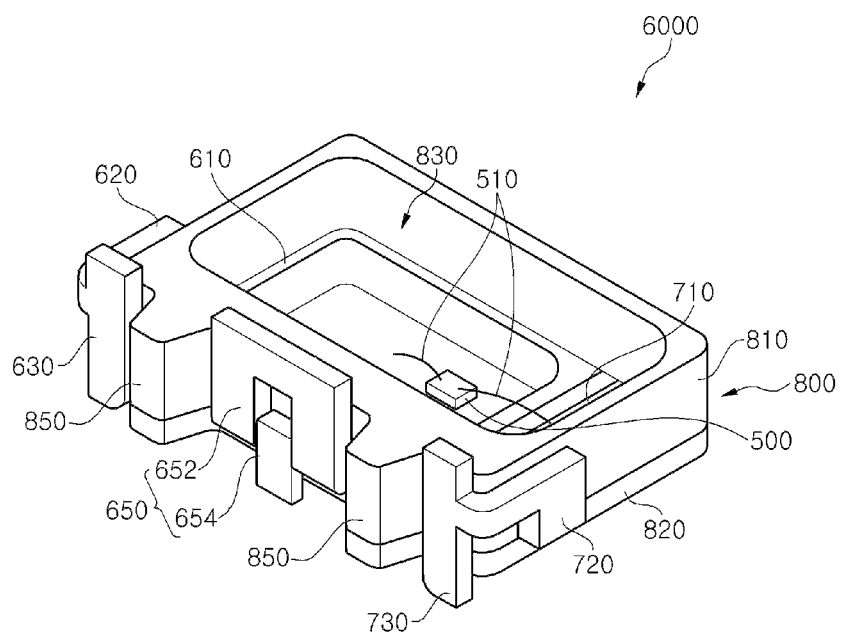
FIG. 19 is a perspective view of an LED package according to another exemplary embodiment of the present invention.
Figure 20:
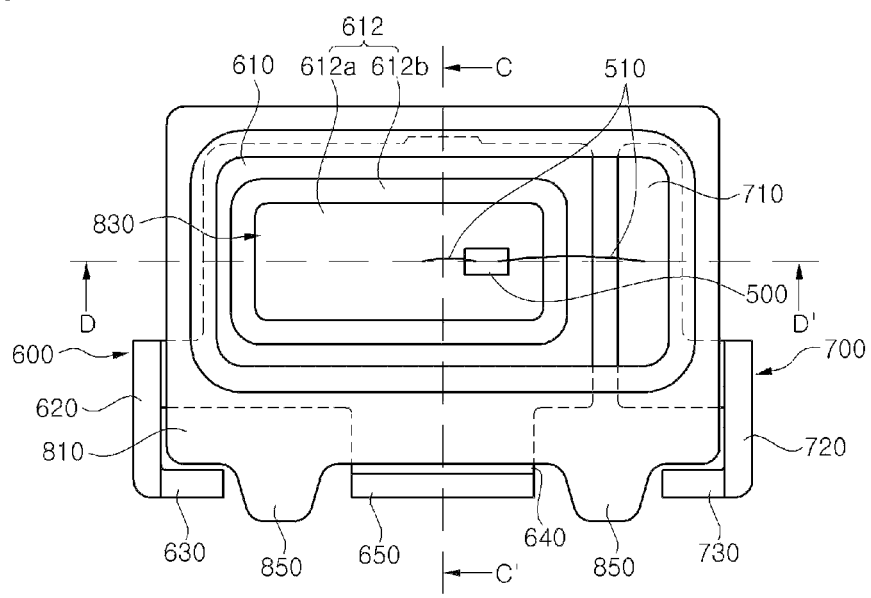
FIG. 20 is a front projection view of the LED package shown in FIG. 19.
Figure 21:
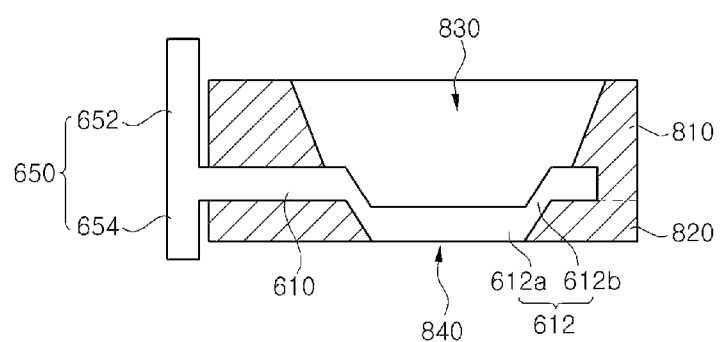
FIG. 21 is a sectional view taken along line C-C' of FIG. 19.
Figure 22:
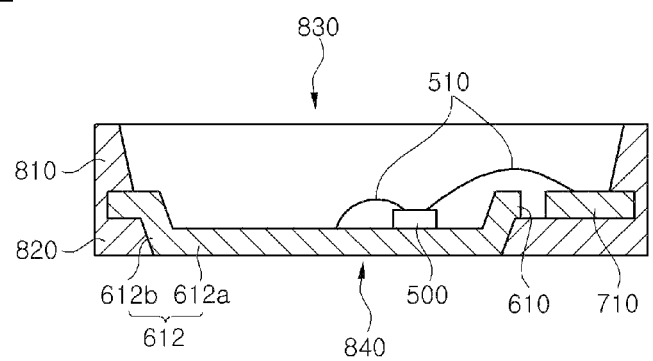
FIG. 22 is a sectional view taken along line D-D' of FIG. 19.
Figure 23:
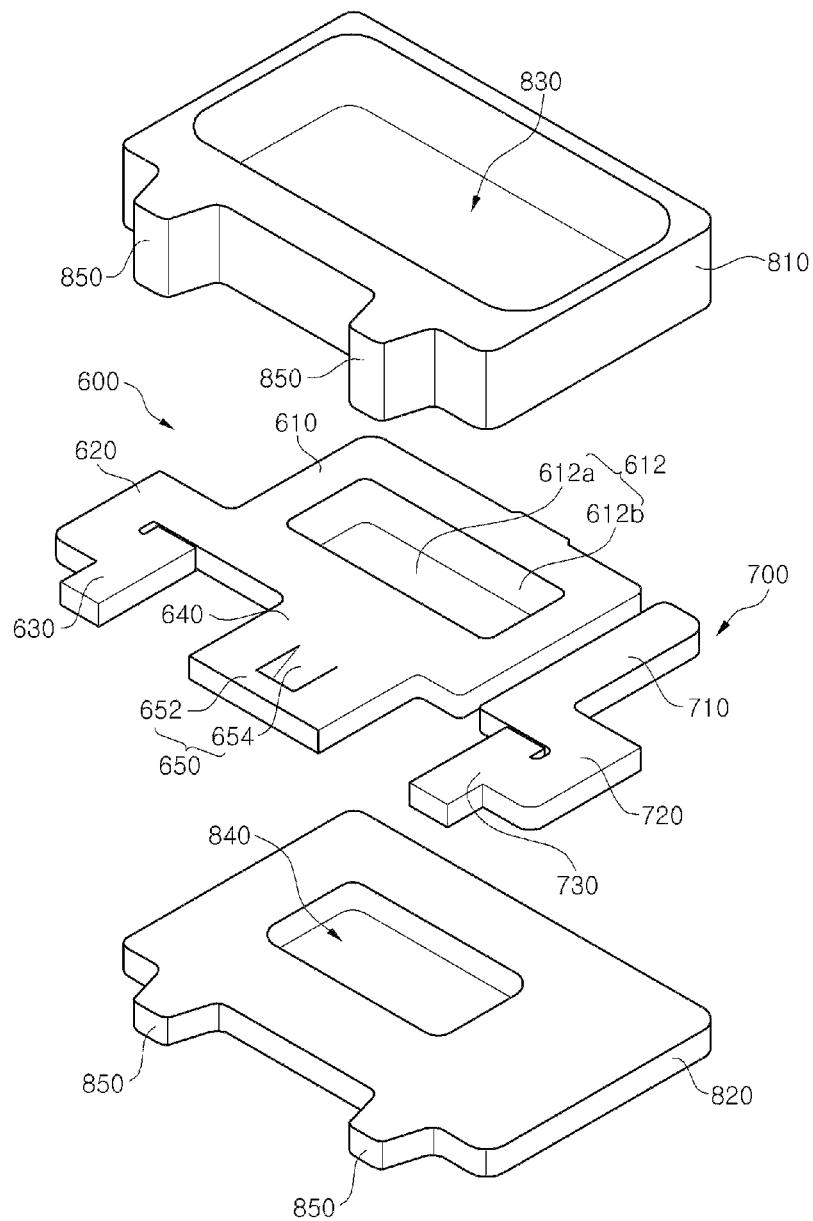
FIG. 23 is an exploded perspective view of the LED package shown in FIG. 19.

FIG. 13 is a perspective view of an LED package according to another exemplary embodiment of the present invention. FIG. 14 is a front view of the LED package shown in FIG. 13. FIG. 15 is a rear view of the LED package shown in FIG. 13. FIG. 16 is a bottom view of the LED package shown in FIG. 13. FIG. 17 is a perspective view of an LED package according to another exemplary embodiment of the present invention. FIG. 18 is a perspective view of an LED package according to another exemplary embodiment of the present invention. FIG. 19 is a perspective view of an LED package according to another exemplary embodiment of the present invention. FIG. 20 is a front projection view of the LED package shown in FIG. 19. FIG. 21 is a sectional view taken along line C-C' of FIG. 19. FIG. 22 is a sectional view taken along line D-D' of FIG. 19. FIG. 23 is an exploded perspective view of the LED package shown in FIG. 19.

Referring to FIGS. 13 to 23, an LED package 6000 according to another exemplary embodiment of the present invention may include an LED chip 500, a lead frame 600/700, and a housing part 800.

Although not shown in the drawings, the LED chip 500 may have a semiconductor structure disposed on a growth substrate or a mount substrate. The semiconductor structure may include an N-type semiconductor layer (not shown), a P-type semiconductor layer (not shown), and an active layer disposed between the N-type semiconductor layer and the P-type semiconductor layer. The semiconductor structure may have a structure for emitting one or more wavelengths. The LED chip 500 may have one or more semiconductor structures disposed on a growth substrate or a mount substrate, and may have a plurality of growth substrates or mount substrates that are connected in parallel or in series and have one or more semiconductor structures disposed thereon.

The lead frame 600/700 may include a first lead 200 and a second lead 700.

The first lead 600 may include a first lead body 610, a first lead extension part 620, a first lead terminal part 630, and a lead heat dissipating part 640/650. The first lead body 610 may have a mounting part 612. The mounting part 612 may have a bottom part 612a and a side part 612b. The lead heat dissipating part 640/650 may include a heat dissipating extension part 640 and a heat dissipating contact part 650.

The second lead 700 may include a second lead body 710, a second lead extension part 720, and a second lead terminal part 730.

The housing part 800 may include an upper housing part 810, a lower housing part 820, an opening part 830, an exposing part 840, and a protrusion part 850.

The LED chip 500 may be disposed on one side of the first lead 600. For example, the LED chip 500 may be disposed on a predetermined region of the first lead body 610 of the first lead 600. Specifically, the LED chip 500 may be disposed on the bottom part 612a of the mounting part 612.

The mounting part 612 may be a portion of the first lead body 610 of the first lead 600. For example, the mounting part 612 may be a concave portion of the first lead body 610.

The mounting part 612 may be exposed by the housing part 800. Specifically, the mounting part 612 may be exposed by the opening part 830 disposed at the upper housing part 810.

As described above, the mounting part 612 may have the bottom part 612a and the side part 612b. One side of the bottom part 612a may mount the LED chip 500, and the other side of the bottom part 612a may be exposed through the exposing part 840 disposed at the lower housing part 820. The bottom part 612a exposed through the exposing part 840 may dissipate heat generated by the LED chip 500.

The side part 612b of the mounting part 612 may extend from the bottom part 612a, and may connect the bottom part 612a and the other part of the first lead body 610, i.e., the first lead body 610 except the mounting part 612. The side part 612b may be inclined at an angle to the bottom part 612a and serve as a reflection surface for reflecting light that is emitted by the LED chip 500 mounted on the bottom part 612a.

As shown in FIG. 14, the LED chip 500 may be mounted on the bottom part 612a of the mounting part 612 closer to the side of the second lead body 710, instead of being mounted on the center of the bottom part 612a of the mounting part 612. The LED chip 500 may be mounted on the lead frame 600/700 in various configurations. However, when the LED chip 500 is connected by wires 510 as shown in the drawings, and when the LED chip 500 is mounted on the center of the bottom part 612a of the mounting part 612, the wire 510 connecting the LED chip 500 and the second lead body 710 may be disconnected due to the great distance between the LED chip 500 and the second lead body 710. Therefore, it may be preferable that the LED chip 500 is mounted on the bottom part 612a of the mounting part 612 closer to the side of the second lead body 710.

Although the drawings show that the LED chip 500 is connected by two wires 510, it will be understood that the LED chip 500 may be connected by two wires 510 or by only one wire 510 according to the shape or type of the LED chip 500.

As described above, the first lead 600 may include the first lead body 610 having the mounting part 612, the first lead extension part 620, the first lead terminal part 630, and the lead heat dissipating part 640/650, and the lead heat dissipating part 640/650 may include the heat dissipating extension part 640 and the heat dissipating contact part 650.

The first lead body 610 may have a portion covered by the housing part 800. The first lead body 610 may have the mounting part 612 with a concave portion.

The first lead extension part 620 may extend from the first lead body 610, and may connect with the first lead terminal part 630. The first lead extension part 620 may have a portion covered by the housing part 800 and the other portion exposed to the outside. The first lead extension part 620 may be bent one or more times so that the first lead terminal part 630 may be disposed on one side (i.e., a support side 805) of the housing part 800, which will be described below. The support side 805 may contact a substrate or a device that will mount the LED package 6000.

The first lead extension part 620 may extend from the first lead body 610. Herein, when exposed through any one of two sides adjacent to one side (i.e., a support side 805) of the housing part 800, the first lead extension part 620 may be bent two times so that the first lead terminal part 630 may be disposed on the support side 805. A thickness T1 of the support side 805 of the housing part 800 may be greater than a thickness T2 of an opposite side 815, as shown in a plan view in FIG. 14.

When the LED package 6000 is mounted on a substrate or a device, the first lead terminal part 630 may not only serve as an electric terminal of the LED package 6000 and but also support the LED package 6000. When the LED package 6000 is mounted on a substrate or a device, the first lead terminal part 630 may be adhered with solder or paste to a terminal disposed on the substrate or the device. Therefore, it may be preferable that the first lead terminal part 630 has a large surface area. Thus, the first lead terminal part 630 may be wider than the first lead extension part 620. The first lead extension part 620 may be narrow because it has a bent portion, whereas the first lead terminal part 630 may be wide because it has a large surface area.

Also, when the LED package 6000 is mounted on a substrate or a device, the first lead terminal part 630 may serve as a support member for supporting the LED package 6000 to prevent the LED package 6000 from being inclined or collapsed. For example, as shown in FIG. 17, the first lead terminal part 630 may protrude toward the front or rear side of the LED package 6000 by a predetermined length. That is, the length of the first lead terminal part 630 may be greater than the thickness of the LED package 6000, and the first lead terminal part 630 may connect with the first lead extension part 620 in a T-shape configuration, so that the first lead terminal part 630 may protrude toward the front or rear side of the LED package 6000 by a predetermined length.

The heat dissipating extension part 640 may extend from the first lead body 610 through the support side 805 of the housing part 800. The heat dissipating extension part 640 may connect with the heat dissipating contact part 650. The heat dissipating extension part 640 may be bent at least one time so that the heat dissipating contact part 650 may be disposed on the support side 805 of the housing part 800.

The heat dissipating contact part 650 may dissipate heat that is generated by the LED chip 500 mounted on the mounting part 612 of the first lead body 610. Also, like the first lead terminal part 630, the heat dissipating contact part 650 may not only serve as an electric terminal but also support the LED package 6000.

When the heat dissipating contact part 650 plays a greater role in supporting the LED package 6000 than in dissipating the heat generated by the LED chip 500, the heat dissipating extension part 640 may be narrower than the heat dissipating contact part 650 so that it may be easily bent. On the other hand, when the heat dissipating contact part 650 plays the greater role in dissipating the heat generated by the LED chip 500, the heat dissipating extension part 640 may have the same width as the heat dissipating contact part 650, in order to increase the thermal conductivity.

When the LED package 6000 is mounted on a substrate or a device, the heat dissipating contact part 650 may serve as a support member for supporting the LED package 6000 to prevent the LED package 6000 from being inclined or collapsed. For example, as shown in FIG. 18, the heat dissipating contact part 650 may be divided into a first heat dissipating contact part 652 and a second heat dissipating contact part 654. The first heat dissipating contact part 652 may protrude toward the front side of the LED package 6000 by a predetermined length, and the second heat dissipating contact part 654 may protrude toward the rear side of the LED package 6000 by a predetermined length. That is, the heat dissipating contact part 650 may be divided into the first heat dissipating contact part 652 and the second heat dissipating contact part 654, so that it may protrude toward the front or rear side of the LED package 6000 by a predetermined length.

As described above, the second lead 700 may include the second lead body 710, the second lead extension part 720, and the second lead terminal part 730.

The second lead body 710 may be spaced apart from the first lead body 610 by a predetermined distance. The second lead body 710 may have a portion covered by the housing part 800 and another portion exposed by the opening part 830 of the housing part 800. The exposed portion of the second lead body 710 may be connected by the wire 510 to the LED chip 500.

The second lead extension part 720 and the second lead terminal part 730 may correspond to the first lead extension part 620 and the first lead terminal part 630. That is, the second lead extension part 720 may extend from the second lead body 710, and may connect with the second lead terminal part 730. The second lead extension part 720 may have a portion covered by the housing part 800 and the other portion exposed to the outside. The second lead extension part 720 may be bent one or more times so that the second lead terminal part 730 may be disposed on one side (i.e., a support side 805) of the housing part 800, which will be described below.

The second lead extension part 720 may extend from the second lead body 710. Herein, when exposed through any one of two sides adjacent to one side (i.e., a support side 805) of the housing part 800, the second lead extension part 720 may be bent two times so that the second lead terminal part 730 may be disposed on the support side 805.

When the LED package 6000 is mounted on a substrate or a device, the second lead terminal part 730 may not only serve as an electric terminal of the LED package 6000 and but also support the LED package 6000. When the LED package 6000 is mounted on a substrate or a device, the second lead terminal part 730 may be adhered with solder or paste to a terminal disposed on the substrate or the device. Therefore, it may be preferable that the second lead terminal part 730 has a large surface area. Thus, the second lead terminal part 730 may be wider than the second lead extension part 720. The second lead extension part 720 may be narrow because it has a bent portion, whereas the second lead terminal part 730 may be wide because it has a large surface area.

Also, when the LED package 6000 is mounted on a substrate or a device, the second lead terminal part 730 may serve as a support member for supporting the LED package 6000 to prevent the LED package 6000 from being inclined or collapsed. For example, as shown in FIG. 17, the second lead terminal part 730 may protrude toward the front or rear side of the LED package 6000 by a predetermined length. That is, the length of the second lead terminal part 730 may be greater than the thickness of the LED package 6000, and the second lead terminal part 730 may connect with the second lead extension part 720 in a T-shape configuration, so that the second lead terminal part 730 may protrude toward the front or rear side of the LED package 6000 by a predetermined length.

As described above, the housing part 800 may include the upper housing part 810, the lower housing part 820, the opening part 830, the exposing part 840, and the protrusion part 850.

It has been shown and described above that the housing part 800 is divided into the upper housing part 810 and the lower housing part 820. However, it will be understood that the housing part 800 may be one part instead of being divided into the upper housing part 810 and the lower housing part 820.

The housing part 800 may cover a portion of the first lead 600 and a portion of the second lead 700. The housing part 800 may have the opening part 830 at the upper housing part 810 to expose the mounting part 612 mounting the LED chip 500. Also, the housing part 800 may have the exposing part 840 at the lower housing part 820 to expose the rear side of the mounting part 612, specifically the rear surface of the bottom part 612a of the mounting part 612.

The opening part 830 of the housing part 800 may be inclined at an angle to the bottom part 612a. When the side of the opening part 830 is inclined at an angle to the bottom part 612a, it may be used as a reflection surface for reflecting light emitting by the LED chip 500.

The housing part 800 may have four sides, any one of which may be the support side 805 described above. One or more support parts 450 may be disposed at the support side 805. The support parts 450 may protrude from the support side 805 of the housing part 800 at regular intervals. When the LED package 6000 is mounted on a substrate or a device, not only the protrusion part 850 but also the first lead terminal part 630, the second lead terminal part 730 and the heat dissipating contact part 650 may contact the substrate or the device to prevent the LED package 6000 from being mounted at an angle onto the substrate or the device, or being collapsed after being mounted on the substrate or the device.

The protrusion part 850 may have a constant thickness and a variable width decreasing away from the support side 805. That is, the protrusion part 850 may have a trapezoidal shape with a uniform thickness. The protrusion part 850 may have the same thickness as the housing part 800 or may have a smaller thickness than the housing part 800. The thickness of the protrusion part 850 may be constant regardless of the distance from the support side 805, or may be decrease away from the support side 805.

Also, when the LED package 6000 is mounted on a substrate or a device, the protrusion part 850 may serve as a support member for supporting the LED package 6000 to prevent the LED package 6000 from being inclined or collapsed. For example, as shown in FIGS. 13 to 16, the protrusion part 850 may protrude toward the bottom side of the LED package 6000 by a predetermined length. That is, the protrusion part 850 may protrude toward the bottom side of the LED package 6000 so that it may protrude from the surfaces of the first lead terminal part 630 and the second lead terminal part 730 by a predetermined length. When the LED package 6000 is mounted on a substrate or a device, the substrate or the device may have a groove part or a through part corresponding to the protrusion part 850, and the protrusion part 850 may be inserted into the groove part or the through part of the substrate or the device to support the LED package 6000 to support the LED package 6000.

The surfaces of the first lead terminal part 630, the second lead terminal part 730, and the heat dissipating contact part 650 may be located on the same plane. When the protrusion part 850 does not protrude over the surfaces of the first lead terminal part 630, the second lead terminal part 730, and the heat dissipating contact part 650 as shown in FIGS. 17 and 18, the surface of the protrusion part 850 may be located on the same plane as the surfaces of the first lead terminal part 630, the second lead terminal part 730, and the heat dissipating contact part 650.

When the LED package 6000 is mounted on a substrate or a device, the surfaces of the first lead terminal part 630, the second lead terminal part 730, the heat dissipating contact part 650 and the protrusion part 850 on the support side 805 may have the maximum contact area with respect to the surface of the substrate or the device to prevent the LED package 6000 from being collapsed or inclined.

This may be implemented by configuring the LED package 6000 to have a low gravitational center, i.e., a gravitational center lower than a geometrical center. For example, the LED package 6000 may have a low gravitational center by disposing not only the first lead terminal part 630, the second lead terminal part 730 and the heat dissipating contact part 650 but also the protrusion part 850 on the support side 805, as described above.

Figure 30:
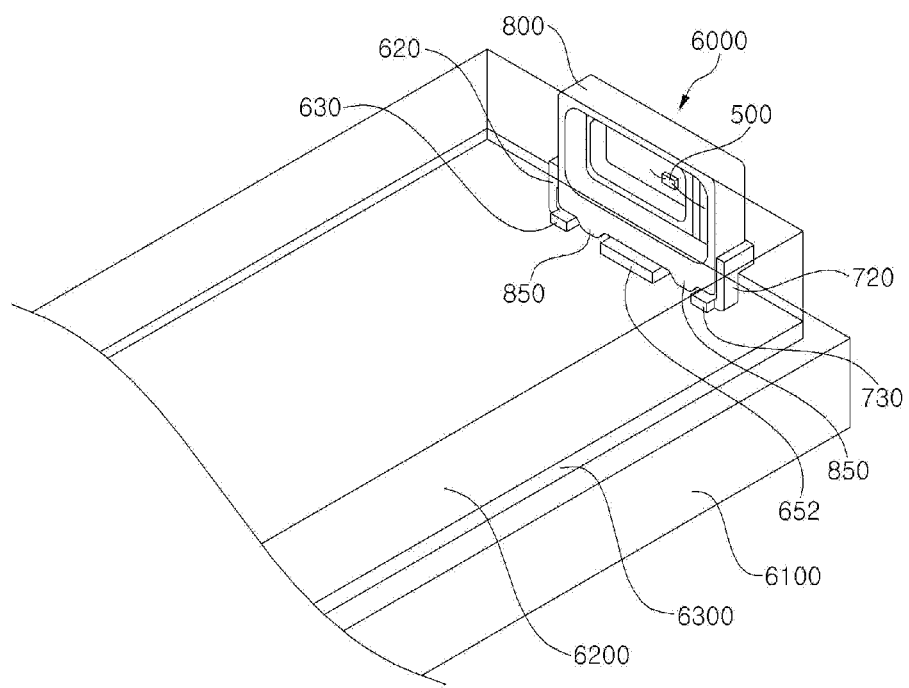
FIG. 30 is a schematic view showing another exemplary embodiment in which the LED packages according to the exemplary embodiment of the present invention are used as a light source of a backlight unit.
Figure 31:
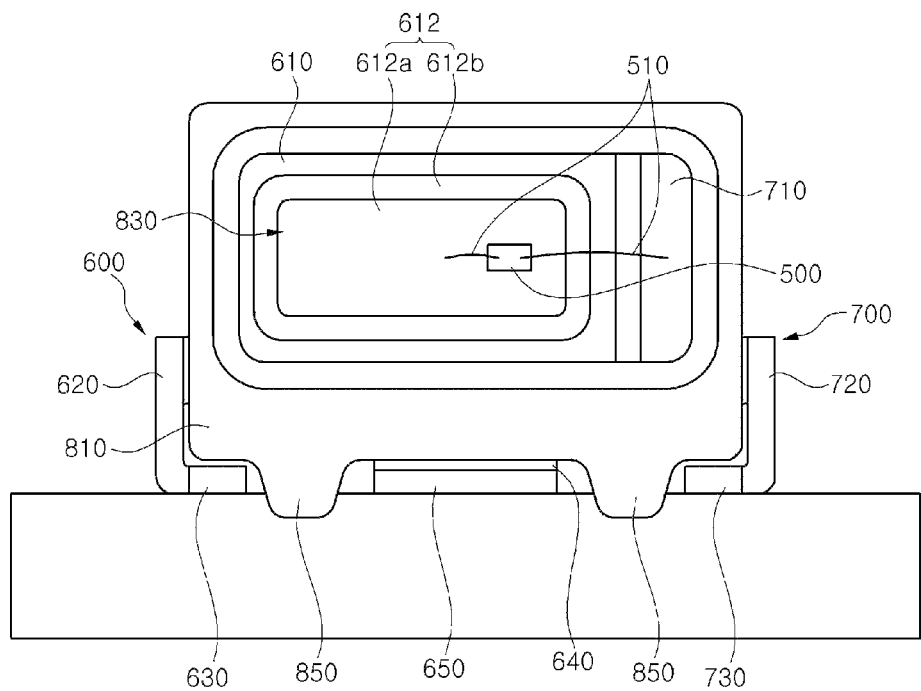
FIG. 31 is a schematic front view of FIG. 30.
Figure 32:
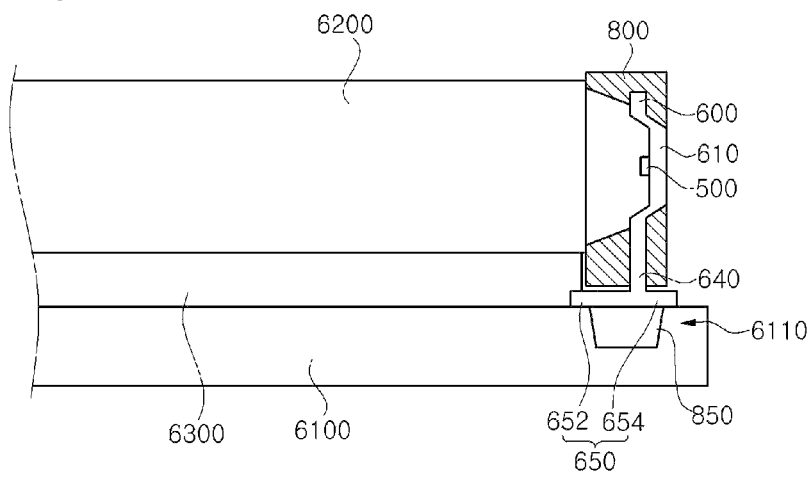
FIG. 32 is a schematic sectional view of FIG. 30.

Also, the LED package 6000 may have a low gravitational center by forming the edge (among the four edges of the housing part 800) contacting the support side 805, to be wider than the edge contacting an upper side that is opposite to the support side 805, preferably by forming the edge contacting the support side 805, to be wider than the edges contacting the upper side and both sides that are adjacent to the support side 805. The edge contacting the support side 805 (among the four edges of the housing part 800) may be wider than the other edges. That is, the edge contacting the support side 805 may be thick. This is to compensate the spacing distance of a light guide plate 6200 from a substrate 6100 so that the LED chip 500 of the LED package 6000 may be located on the central axis of the light guide plate 6200, as shown in FIGS. 30 to 32.

Two protrusion parts 850 may be disposed on the support side 805. In this case, as shown in the drawings, the heat dissipating contact part 650 may be disposed at the center of the support side 805. The first lead terminal part 630 and the second lead terminal part 730 may be disposed at both edges of the support side 805. One of the two protrusion parts 850 may be disposed between the first lead terminal part 630 and the heat dissipating contact part 650, and the other protrusion part 850 may be disposed between the heat dissipating contact part 650 and the second lead terminal part 730. In this case, the support side 805 may be symmetrical with respect to the heat dissipating contact part 650 to prevent the LED package 6000 from being inclined to the front and rear sides or to both sides.

As shown in FIGS. 13 to 16, the protrusion part 850 may protrude toward the bottom side of the LED package 6000 in comparison with the first lead terminal part 630 and the second lead terminal part 730. As shown in FIG. 17, the first lead terminal part 630 or the second lead terminal part 730 may have a length greater than the thickness of the housing part 800, so that it may protrude toward the front or rear side of the LED package 6000 by a predetermined length. As shown in FIG. 18, the heat dissipating contact part 650 may protrude toward the front or rear side of the LED package 6000 by a predetermined length, that is, the heat dissipating contact part 650 may have the first heat dissipating contact part 652 and the second heat dissipating contact part 654 that protrude toward the front or rear side of the LED package 6000 by a predetermined length. As shown in FIG. 19, the protrusion part 850, the first or second lead terminal parts 630 or 730, and the heat dissipating contact part 650 described with reference to FIGS. 13 to 18 may protrude toward the bottom side of the LED package 6000 by a predetermined length or may be protrude toward the front or rear side of the LED package 6000 by a predetermined length.

Therefore, when the LED package 6000 is mounted on a substrate or a device, the LED package 6000 may have a low gravitational center by forming the edge contacting the support side 805 (among the four edges of the housing part 800), to be wider than the edges contacting the other sides.

According to the exemplary embodiments of the present invention, two or more of the surfaces of the first lead terminal part 630, the second lead terminal part 730 and the heat dissipating contact part 650 are disposed on the same plane to maximize the contact area between the surfaces and the substrate or the device, thereby making it possible to prevent the LED package 6000 from being collapsed or inclined.

Also, according to the exemplary embodiments of the present invention, two protrusion parts 850 are disposed on the support side 805 so that the support side 805 has a symmetrical structure, thereby making it possible to prevent the LED package 6000 from being inclined to both sides.

Also, according to the exemplary embodiments of the present invention, the first or second lead terminal part 630 or 730 and the heat dissipating contact part 650 protrudes toward the front or rear side of the LED package 6000 by a predetermined length and the protrusion part 850 protrudes toward the bottom side of the LED package 6000 by a predetermined length to support the LED package 6000 on the surface of the substrate or the device, thereby making it possible to prevent the LED package 6000 from being collapsed or inclined.

Also, according to the exemplary embodiments of the present invention, the edge contacting the support side 805 is formed to be thick and the protrusion parts 850 protrude from the support side 805 at regular intervals. When the LED package 6000 is used as a light source of a backlight unit, the thick edge and the protrusion parts 850 compensates the height of the LED chip 500 so that the LED chip 500 of the LED package 6000 is disposed at the position corresponding to the light guide plate (specifically, at the position corresponding to the central axis of the light guide plate).

Figure 24:
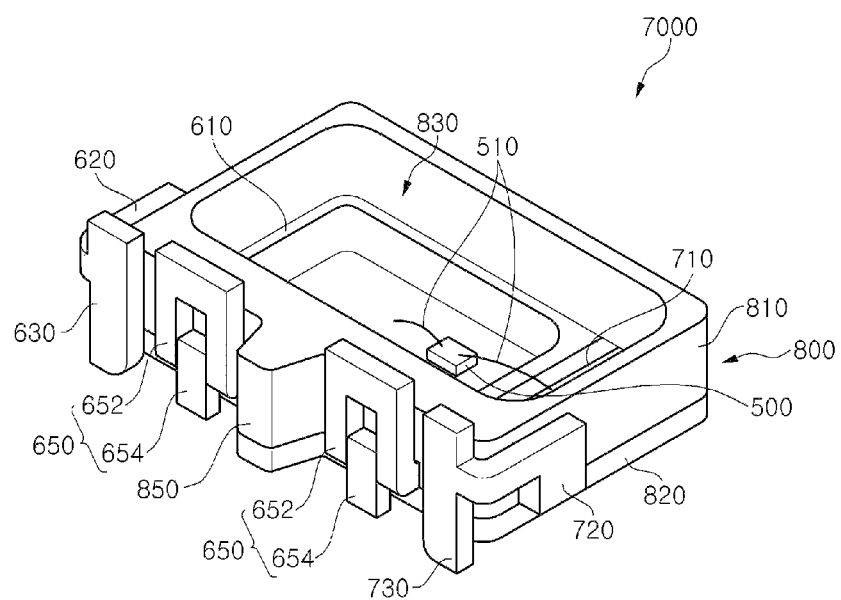
FIG. 24 is a perspective view of an LED package according to another exemplary embodiment of the present invention.

FIG. 24 is a perspective view of an LED package according to another exemplary embodiment of the present invention.

Referring to FIG. 24, an LED package 7000 according to another exemplary embodiment of the present invention may have a protrusion part 850 on the support side 805. The protrusion part 850 may be disposed at the center of the support side 805. One or more heat dissipating contact parts 650 may be disposed respectively at both sides of the protrusion part 850. The first lead terminal part 630 and the second lead terminal part 730 may be disposed respectively at the outsides of the heat dissipating contact parts 650, i.e., at both edges of the support side 805. The other structures are identical to those of the LED package 6000 described with reference to FIGS. 13 to 23, and thus a detailed description thereof will be omitted for conciseness.

That is, the LED package 6000 and the LED package 2000 have the same structures with the exception that they differ in the number and positions of the protrusion parts 850 and the heat dissipating contact parts 650.

Figure 25:
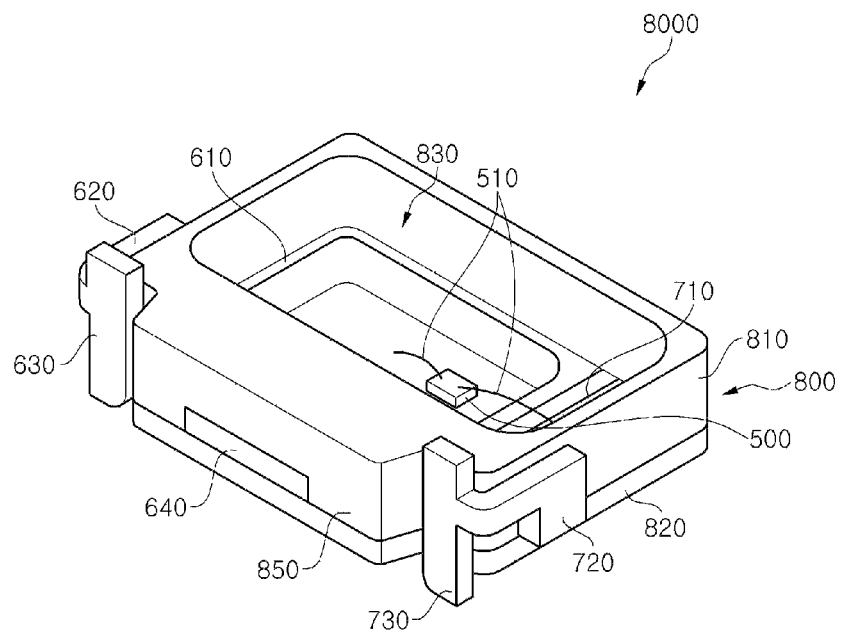
FIG. 25 is a perspective view of an LED package according to another exemplary embodiment of the present invention.

FIG. 25 is a perspective view of an LED package according to another exemplary embodiment of the present invention.

Referring to FIG. 25, an LED package 8000 according to another exemplary embodiment of the present invention has the same structures as the LED package 6000 of FIGS. 13 to 23 with the exception that it has the first lead terminal part 630, the second lead terminal part 730, and the protrusion part 850 on the support side 805 without having the lead heat dissipating part 640/650 (specifically, the heat dissipating contact part 650 of the lead heat dissipating part 640/650) on the support side 805.

That is, the LED package 8000 may have the first lead terminal part 630 and the second lead terminal part 730 disposed at both edges of the support side 805, and the protrusion part 850 disposed on almost all the surfaces of the support side 805, including the center of the support side 805, except both edges of the support side 805. A portion of the lead heat dissipating part 640/650 (preferably, a portion of the heat dissipating extension part 640) may be exposed on the surface of the protrusion part 850.

Although FIG. 25 shows that one protrusion part 850 is disposed on the support side 805, it will be understood that two or more protrusion parts 850 may be disposed on the support side 805.

Figure 26:
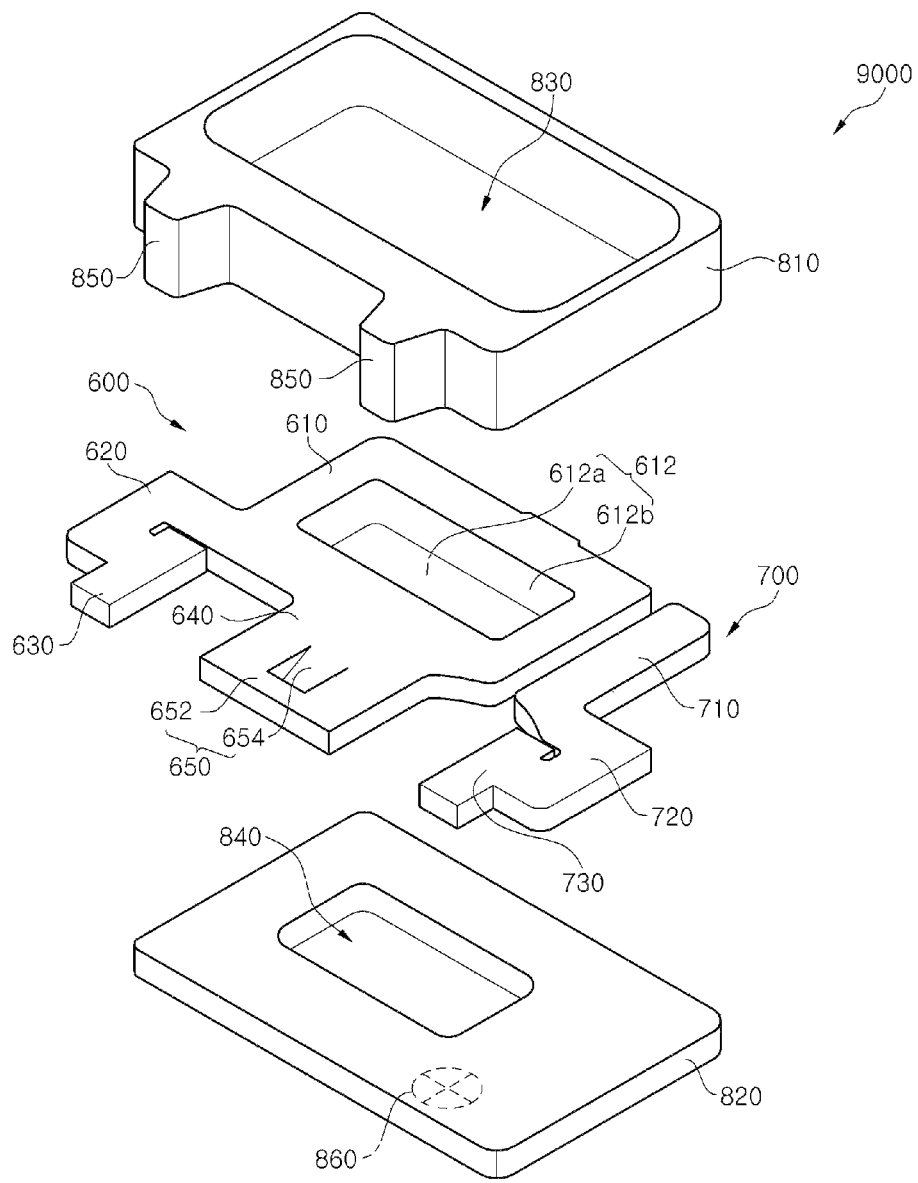
FIG. 26 is an exploded perspective view of an LED package according to another exemplary embodiment of the present invention.

FIG. 26 is an exploded perspective view of an LED package according to another exemplary embodiment of the present invention.

Referring to FIG. 26, an LED package 9000 according to another exemplary embodiment of the present invention has the same structures as the LED package 6000 of FIGS. 13 to 23 with the exception that they differ in the structures of the lead frame 600/700 and the lower housing part 820.

The LED package 9000 may have a resin injection port 860 at a predetermined position of the rear side of the lower housing part 820 without having the protrusion part 850 at the lower housing part 820. Since the protrusion part 850 is not provided at the lower housing part 820, the lower housing part 820 may have a substantially rectangular shape.

The resin injection port 860 may be used to inject resin to form the housing part 800. When the resin injection port 860 is provided at a predetermined position of the lower housing part 820, the first lead 600 and the second lead 700 located corresponding to the resin injection port 860 may be modified as shown in FIG. 26, so as not to interrupt the flow of resin injected through the resin injection port 860.

Figure 27:
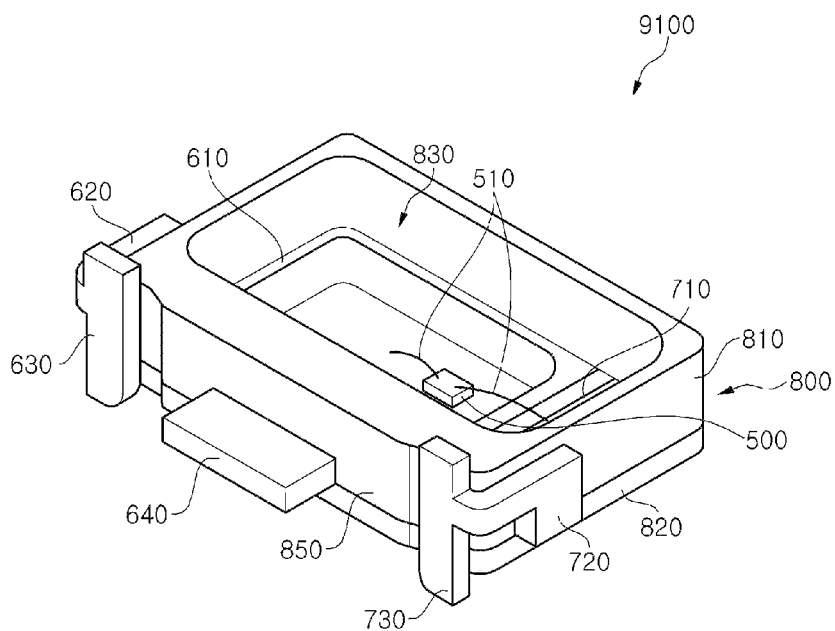
FIG. 27 is a perspective view of an LED package according to another exemplary embodiment of the present invention.

FIG. 27 is a perspective view of an LED package according to another exemplary embodiment of the present invention.

Referring to FIG. 27, an LED package 9100 according to another exemplary embodiment of the present invention has the same structures as the LED package 6000 of FIGS. 13 to 23 with the exception that it has the first lead terminal part 630, the second lead terminal part 730, and the protrusion part 850 on the support side 805 without having the lead heat dissipating part 640/650 (specifically, the heat dissipating contact part 650 of the lead heat dissipating part 640/650) on the support side 805.

That is, the LED package 9100 may have the first lead terminal part 630 and the second lead terminal part 730 disposed at both edges of the support side 805, and the protrusion part 850 disposed on almost all the surfaces of the support side 805, including the center of the support side 805, except both edges of the support side 805. A portion of the lead heat dissipating part 640/650 (preferably, a portion of the heat dissipating extension part 640) may be exposed on the surface of the protrusion part 850 by extending from the protrusion part 850. The end of the heat dissipating extension part 640 may be disposed on the same plane as the first lead terminal part 630 and the second lead terminal part 730. That is, the end of the heat dissipating extension part 640, the surface of the first lead terminal part 630, and the surface of the second lead terminal part 730 may be disposed on the same plane. Also, as shown in FIG. 27, the end of the heat dissipating extension part 640 may protrude over the plane of the first lead terminal part 630 and the second lead terminal part 730, that is, may protrude toward the bottom side of the LED package 9100 by a predetermined length, so that the heat dissipating extension part 640 may serve as a support member for supporting the LED package 9100 like the protrusion part 850 described with reference to FIGS. 13 to 16.

Figure 28:
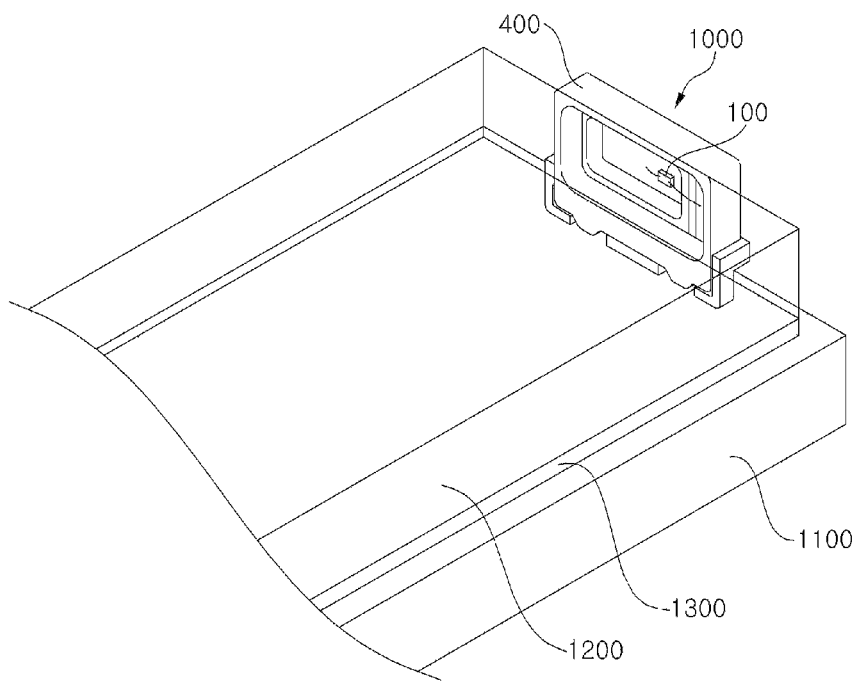
FIG. 28 is a schematic view showing an exemplary embodiment in which the LED packages according to the exemplary embodiment of the present invention are used as a light source of a backlight unit.
Figure 29:
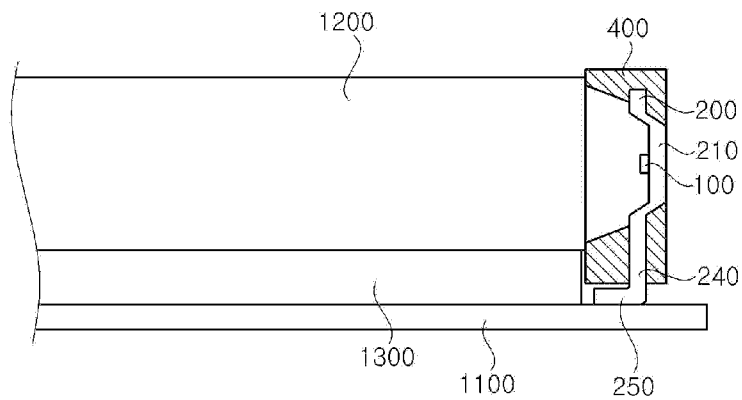
FIG. 29 is a schematic sectional view of FIG. 28.

FIGS. 28 and 29 are views showing an exemplary embodiment in which the LED package according to the exemplary embodiments of the present invention is used as a light source of a backlight unit.

FIG. 28 is a schematic view showing an exemplary embodiment in which the LED packages according to the exemplary embodiment of the present invention are used as a light source of a backlight unit. FIG. 29 is a schematic sectional view of FIG. 28.

Referring to FIGS. 28 and 29, the LED packages 1000, 2000, 3000, 4000 and the 5000 according to the exemplary embodiments of the present invention may be used as a light source of a backlight unit. FIGS. 28 and 29 illustrate that the LED package 1000 according to the exemplary embodiment of the present invention is used as a light source of a backlight unit.

The LED package 1000 may be mounted on a substrate 1100 of a backlight unit. The support side 805 of the LED package 1000 may be attached to the edge of an edge surface of the substrate 1100 to mount the LED package 1000 on the substrate 1100. The first lead terminal part 230, the second lead terminal part 330, the heat dissipating contact part 250, and the support part 450 may be provided at the support side 805 to mount the LED package 1000 at a right angle onto the substrate 1100, and to prevent the LED package 1000 from being collapsed after being mounted on the substrate 1100. Although FIGS. 28 and 29 show that one LED package 1000 is mounted on the substrate 1100, it will be understood that a plurality of LED packages 1000 may be mounted on the substrate 1100.

A light guide plate 1200 may be disposed on the substrate 1100. The light guide plate 1200 may be adhered by an adhesive layer 1300 disposed on the substrate 1100. Although not shown in the drawings, other layers may be further disposed between the substrate 1100 and the light guide plate 1200. The light guide plate 1200 may be provided corresponding to the opening part 430 of the LED package 1000.

As described above, a plurality of layers including the adhesive layer 1300 may be disposed between the substrate 1100 and the light guide plate 1200 so that the light guide plate 1200 may be spaced apart from the substrate 1100 by a predetermined distance. As described above, in the LED package 1000, the edge contacting the support side 805 may be thicker than the edge of another side (preferably, the upper side that is opposite to the support side 805). The spacing distance of the light guide plate 1200 from the substrate 1100 may be compensated by the sum of the height of the support part 450 and the thickness of the edge contacting the support side 805, so that the LED chip 100 of the LED package 1000 may be disposed at the position corresponding to the light guide plate 1200, as shown in FIGS. 28 and 29.

FIGS. 30 to 32 are views showing another exemplary embodiment in which the LED package according to the exemplary embodiments of the present invention is used as a light source of a backlight unit.

FIG. 30 is a schematic view showing another exemplary embodiment in which the LED packages according to the exemplary embodiment of the present invention are used as a light source of a backlight unit. FIG. 31 is a schematic front view of FIG. 30. FIG. 32 is a schematic sectional view of FIG. 30.

Referring to FIGS. 30 to 32, the LED packages 6000, 7000, 8000, 9000 and 9100 according to the exemplary embodiments of the present invention may be used as a light source of a backlight unit by being mounted on a substrate or a device. FIGS. 30 to 32 illustrate that the LED package 6000 of FIG. 19 is used as a light source of a backlight unit.

The LED package 6000 may be mounted on a substrate 6100 of the backlight unit. For example, the substrate 6100 may be a PCB substrate.

The support side 805 of the LED package 6000 may be attached to the edge on one side surface of the substrate 6100 to mount the LED package 6000 on the substrate 6100. The first lead terminal part 630, the second lead terminal part 630, the heat dissipating contact part 650, and the protrusion part 850 may be provided at the support side 805 to mount the LED package 6000 at a right angle onto the substrate 6100, and to prevent the LED package 6000 from being collapsed after being mounted on the substrate 6100. In particular, the first lead terminal part 630, the second lead terminal part 630, and the heat dissipating contact part 650 may have a length greater than the thickness of the LED package 6000, so that it may protrude toward the front or rear side of the LED package 6000 by a predetermined length and serve as a support member for supporting the LED package 6000. In this case, the LED package 1000 may be more securely mounted a right angle onto the substrate 1100, and the LED package 1000 may be more effectively prevented from being collapsed after being mounted on the substrate 6100. Also, the substrate 6100 may have a groove part 6110 or a through part (not shown) in the region corresponding to the mounting region of the LED package 6000, and the LED package 6000 may have the protrusion part 850 that protrude toward the bottom side of the LED substrate 6000 by a predetermined length. When the protrusion part 850 is inserted into the groove part 6110 or the through part, the LED package 6000 may be more effectively prevented from being inclined or collapsed when mounted on the substrate or the device.

Although FIGS. 30 to 32 show that one LED package 6000 is mounted on the substrate 6100, it will be understood that a plurality of LED packages 6000 may be mounted on the substrate 6100.

A light guide plate 6200 may be disposed on the substrate 6100. The light guide plate 6200 may be adhered by an adhesive layer 6300 disposed on the substrate 6100. Although not shown in the drawings, other layers may be further disposed between the substrate 6100 and the light guide plate 6200. The light guide plate 6200 may be provided corresponding to the opening part 830 of the LED package 6000.

As described above, a plurality of layers including the adhesive layer 6300 may be disposed between the substrate 6100 and the light guide plate 6200 so that the light guide plate 6200 may be spaced apart from the substrate 6100 by a predetermined distance. As described above, in the LED package 6000, the edge contacting the support side 805 may be thicker than the edge of another side (preferably, the upper side that is opposite to the support side 805). The spacing distance of the light guide plate 6200 from the substrate 6100 may be compensated by the sum of the height of the protrusion part 850 and the thickness of the edge contacting the support side 805, so that the LED chip 500 of the LED package 6000 may be disposed at the position corresponding to the light guide plate 6200 (preferably, on the central axis of the light guide plate 6200), as shown in FIGS. 30 and 32.

Thus, although the LED packages according to the embodiments of the present invention are thin, the edge contacting the support side 805 is thick and the protrusion part is provided at the support side 805 to prevent the LED packages from being inclined or collapsed. Accordingly, the LED packages may be used as a light source of a backlight unit.

Also, although the LED packages according to the embodiments of the present invention are thin, the edge contacting the support side 805 is thick and the protrusion part is provided at the support side 805. Accordingly, the LED packages may be stably installed in a carrier tape pocket when moved or handled during processes.

Also, although the LED packages according to the embodiments of the present invention are thin, the edge contacting the support side 805 is thick and the protrusion part is provided at the support side 805. Accordingly, the LED packages may be prevented from being misaligned when moved or handled during processes.

Also, although the LED packages according to the embodiments of the present invention are thin, the support part protrudes toward the front, rear or bottom side of the LED packages by a predetermined length and serves as a support member for supporting the LED packages when mounted on a substrate or a device. Accordingly, the LED packages may be mounted at a right angle onto the substrate, and may be prevented from being collapsed after being mounted on the substrate.

Also, in the LED packages according to the exemplary embodiments of the present invention, the edge contacting the support side 805 is thick, and the protrusion parts protrude from the support side 805 at regular intervals. When the LED packages are used as a light source of a backlight unit, the thick edge or the protrusion parts may compensate the spacing distance of the light guide plate from the substrate so that the LED packages may be disposed at the position corresponding to the light guide plate (specifically, at the position corresponding to the central axis of the light guide plate).

While the present invention has been described with respect to the specific embodiments, it will be apparent to those skilled in the art that various changes and modifications may be made without departing from the spirit and scope of the invention as defined in the following claims.

The invention claimed is:

1. A light emitting diode (LED) package comprising:
a lead frame comprising a first lead and a second lead spaced apart from the first lead;
an LED chip disposed on the first lead;
a housing covering a portion of the lead frame and comprising an opening exposing the LED chip, a support side contacting the first lead and the second lead, and an opposite side that is opposite to the support side; and
a lead heat dissipating part extended from the first lead and partially exposed from the support side of the housing,
wherein the support side of the housing is thicker than the opposite side.

2. The LED package according to claim 1, wherein:
the first lead comprises a heat dissipating contact and a first lead terminal extended on the support side;
the second lead comprises a second lead terminal extended on the support side; and
the housing comprises one or more support parts on the support side.

3. The LED package according to claim 2, wherein:
the first lead comprises a first lead body covered at least partially by the housing, a first lead extension connecting the first lead body and the first lead terminal, and a heat dissipating extension connecting the first lead body and the heat dissipating contact; and
the second lead comprises a second lead body and a second lead extension connecting the second lead body and the second lead terminal.

4. The LED package according to claim 3, wherein the first lead terminal and the second lead terminal are wider than the first lead extension and the second lead extension.

5. The LED package according to claim 3, wherein the first lead extension, the heat dissipating extension, and the second lead extension are bent at least once, such that the first lead terminal, the heat dissipating contact, and the second lead terminal are disposed on the support side.

6. The LED package according to claim 3, wherein the surface of the first lead terminal, the surface of the heat dissipating contact, and the surface of the second lead terminal are disposed on the same plane as the surface of the support side.

7. The LED package according to claim 3, wherein the first lead body comprises a mounting part exposed through the opening.

8. The LED package according to claim 7, wherein the mounting part is a concave portion of the first lead body.

9. The LED package according to claim 7, wherein the mounting part comprises:
a bottom; and
a side extending at an inclined angle from the bottom to another portion of the first lead body,
wherein the LED chip is mounted on the bottom closer to the side of the second lead body than to the center of the bottom.

10. The LED package according to claim 7, wherein the opening exposes the mounting part, a portion of the first lead body, and a portion of the second lead body.

11. The LED package according to claim 1, wherein the housing comprises an exposing part exposing a portion of the first lead.

12. The LED package according to claim 11, wherein the first lead comprises a mounting part exposed by the opening, and the mounting part comprises a bottom upon which the LED chip is mounted, and a side extending at an inclined angle from the bottom to another portion of the first lead body, wherein the exposing part exposes the rear side of the bottom.

13. The LED package according to claim 3, wherein the housing comprises four edges, and the edge of the support side, among four edges contacting the four sides, is wider than the edge contacting an upper side that is opposite to the support side.

14. The LED package according to claim 13, wherein:
the heat dissipating extension is connected to the first lead body through the support side;
the first lead extension is connected to the first lead body through one of two sides of the body adjacent to the support side; and
the second lead extension is connected to the second lead body through the other of the two sides adjacent to the support side.

15. The LED package according to claim 14, wherein the heat dissipating extension is bent one time, and the first lead extension and the second lead extension are each bent two times.

16. The LED package according to claim 2, wherein:
the heat dissipating contact is disposed at the center of the support side;
the first lead terminal and the second lead terminal are disposed at opposing edges of the support side; and
the LED package comprises two of the support parts that are disposed respectively between the heat dissipating contact and the first lead terminal, and between the heat dissipating contact and the second lead terminal.

17. The LED package according to claim 2, wherein:
the first lead terminal and the second lead terminal are disposed at opposing edges of the support side;
the support part is disposed at the center of the support side; and
the LED package comprises two of the heat dissipating contacts that are disposed respectively between the support part and the first lead terminal, and between the support part and the second lead terminal.

18. The LED package according to claim 1, wherein:
the first lead terminal and the second lead terminal are disposed at opposing edges of the support side;
one or more support parts are disposed on the support side, between the first lead terminal and the second lead terminal; and
the lead heat dissipating part is a portion of a heat dissipating extension exposed from the surface of the support part.

19. The LED package according to claim 1, wherein the opening comprises a side inclined at an angle.

20. The LED package according to claim 1, wherein the LED package comprises a support member extending from at least one of the first lead, the second lead, the lead heat dissipating part, and the housing the support member configured to support the housing when the housing is mounted on a substrate or a device.

21. The LED package according to claim 20, wherein:
the first lead comprises a first lead terminal disposed on the support side;
the second lead comprises a second lead terminal disposed on the support side;
the lead heat dissipating part comprises a heat dissipating contact disposed on the support side;
the housing further comprises a protrusion part protruding from the support side; and
one or more of the first lead terminal, the second lead terminal, and the heat dissipating contact are the support member.

22. The LED package according to claim 21, wherein:
the surface of the first lead terminal, the surface of the heat dissipating contact, and the surface of the second lead terminal are located on the same plane; and
the protrusion part protrudes toward the bottom side of the LED package by a length with respect to the surface of the first lead terminal, the surface of the heat dissipating contact, and the surface of the second lead terminal.

23. The LED package according to claim 21, wherein the first lead terminal or the second lead terminal protrudes toward the front or rear side of the LED package by a length.

24. The LED package according to claim 21, wherein the heat dissipating contact protrudes toward the front or rear side of the LED package by a length.

25. The LED package according to claim 21, wherein:
the first lead comprises a first lead body covered at least partially by the housing and a first lead extension connecting the first lead body and the first lead terminal;
the second lead comprises a second lead body and a second lead extension connecting the second lead body and the second lead terminal; and
the lead heat dissipating part comprises a heat dissipating extension connecting the first lead body and the heat dissipating contact.

26. The LED package according to claim 25, wherein the surface of the first lead terminal, the surface of the heat dissipating contact, the surface of the second lead terminal, and the surface of the protrusion part are located on the same plane.

27. The LED package according to claim 21, wherein:
the heat dissipating contact is disposed at the center of the support side;
the first lead terminal and the second lead terminal are disposed at both edges of the support side; and
the LED package comprises two of the protrusion parts that are disposed respectively between the heat dissipating contact part and the first lead terminal and between the heat dissipating contact and the second lead terminal.

28. The LED package according to claim 20, wherein:
the first lead terminal and the second lead terminal are disposed at opposing edges of the support side;
a protrusion part is disposed on the support side between the first lead terminal and the second lead terminal; and
the lead heat dissipating part is a portion of a heat dissipating extension exposed at a surface of the protrusion part.

29. The LED package according to claim 28, wherein:
the first lead terminal and the second lead terminal are disposed on the same plane; and
the heat dissipating extension is the support member and protrudes toward the bottom side of the LED package by a length with respect to the surface of the first lead terminal and the surface of the second lead terminal.

* * * * *